US011708528B2

United States Patent
Lüchinger et al.

(10) Patent No.: US 11,708,528 B2
(45) Date of Patent: *Jul. 25, 2023

(54) LUMINESCENT COMPONENT

(71) Applicant: Avantama AG, Stäfa (CH)

(72) Inventors: Norman Albert Lüchinger, Stäfa (CH); Fangjian Lin, Zürich (CH); Tom Mitchell-Williams, Durham (GB); Stefan Loher, Zürich (CH)

(73) Assignee: Avantama AG, Stäfa (CH)

( * ) Notice: Subject to any disclaimer, the term of this patent is extended or adjusted under 35 U.S.C. 154(b) by 0 days.

This patent is subject to a terminal disclaimer.

(21) Appl. No.: 17/618,450

(22) PCT Filed: Jun. 15, 2020

(86) PCT No.: PCT/EP2020/066466
§ 371 (c)(1),
(2) Date: Dec. 11, 2021

(87) PCT Pub. No.: WO2020/254236
PCT Pub. Date: Dec. 24, 2020

(65) Prior Publication Data
US 2022/0252941 A1   Aug. 11, 2022

(30) Foreign Application Priority Data
Jun. 17, 2019 (EP) .................... 19180680

(51) Int. Cl.
*C09K 11/02* (2006.01)
*C09K 11/06* (2006.01)
(Continued)

(52) U.S. Cl.
CPC .............. *C09K 11/02* (2013.01); *C01D 13/00* (2013.01); *C01D 15/00* (2013.01); *C01D 17/003* (2013.01);
(Continued)

(58) Field of Classification Search
CPC ... C09K 11/025; C09K 11/664; H01L 33/505; H01L 33/502; H01L 33/504; G02F 1/133614
See application file for complete search history.

(56) References Cited

U.S. PATENT DOCUMENTS 11,008,508 B2 *   5/2021   Lüchinger ............. C01G 30/00
2011/0068322 A1   3/2011   Pickett et al.
(Continued)

FOREIGN PATENT DOCUMENTS

WO   2011053635 A1   5/2011
WO   2017106979 A1   6/2017
(Continued)

OTHER PUBLICATIONS

International Search report for corresponding International Patent Application No. PCT/EP2020/066466 dated Mar. 3, 2020.
(Continued)

*Primary Examiner* — C Melissa Koslow
(74) *Attorney, Agent, or Firm* — Renner, Otto, Boisselle & Sklar, LLP

(57) ABSTRACT

Described are luminescent components with excellent performance and stability. The luminescent components comprise a first element including first luminescent crystals from the class of perovskite crystals, embedded a first polymer P1 and a second element comprising a second solid polymer composition, said second polymer composition optionally comprising second luminescent crystals embedded in a second polymer P2. Polymers P1 and P2 differ and are further specified in the claims. Also described are methods for manufacturing such components and devices comprising such components.

13 Claims, 3 Drawing Sheets

(51) Int. Cl.
| | |
|---|---|
| G02F 1/13357 | (2006.01) |
| H01L 33/50 | (2010.01) |
| C09K 11/66 | (2006.01) |
| C09D 5/22 | (2006.01) |
| F21V 3/12 | (2018.01) |
| F21V 9/38 | (2018.01) |
| C01D 13/00 | (2006.01) |
| C01D 15/00 | (2006.01) |
| C01D 17/00 | (2006.01) |
| C01G 17/00 | (2006.01) |
| C01G 19/00 | (2006.01) |
| C01G 21/00 | (2006.01) |
| C01G 29/00 | (2006.01) |
| C01G 30/00 | (2006.01) |
| H01L 33/56 | (2010.01) |
| H10K 50/125 | (2023.01) |
| G02F 1/1335 | (2006.01) |

(52) U.S. Cl.
CPC .............. *C01G 17/00* (2013.01); *C01G 19/00* (2013.01); *C01G 21/00* (2013.01); *C01G 29/00* (2013.01); *C01G 30/00* (2013.01); *C09D 5/22* (2013.01); *C09K 11/025* (2013.01); *C09K 11/06* (2013.01); *C09K 11/664* (2013.01); *F21V 3/12* (2018.02); *F21V 9/38* (2018.02); *G02F 1/133617* (2013.01); *H01L 33/502* (2013.01); *H01L 33/56* (2013.01); *H10K 50/125* (2023.02); *G02F 1/133614* (2021.01); *H01L 2933/0041* (2013.01)

(56) References Cited

U.S. PATENT DOCUMENTS

| | | |
|---|---|---|
| 2015/0047765 A1 | 2/2015 | Vo et al. |
| 2017/0369776 A1 | 12/2017 | Luchinger et al. |
| 2018/0010039 A1 | 1/2018 | Dong et al. |
| 2018/0273841 A1 | 9/2018 | Luchinger et al. |
| 2018/0298278 A1 | 10/2018 | Zhong |
| 2019/0153313 A1 | 5/2019 | Luchinger et al. |
| 2021/0238475 A1 | 8/2021 | Luchinger et al. |

FOREIGN PATENT DOCUMENTS

| | | | |
|---|---|---|---|
| WO | WO 2017/108962 | * | 6/2017 |
| WO | 2018/028869 A1 | | 2/2018 |

OTHER PUBLICATIONS

International Preliminary Report on Patentability for corresponding International Patent Application No. PCT/EP2020/066466 dated Jul. 15, 2021.

* cited by examiner

LUMINESCENT COMPONENT

This application is a national phase of International Application No. PCT/EP2020/066466 filed Jun. 15, 2020, which claims priority to EP 19180680.1 filed Jun. 17, 2019, the entire disclosures of which are hereby incorporated by reference.

TECHNICAL FIELD

The present invention relates to the field of luminescent crystals (LCs), components and devices comprising the same. Particularly, the invention provides a luminescent component, light emitting devices comprising such components, the use of a luminescent component, the use of specific polymers in such components and methods for manufacturing luminescent components and light emitting devices.

BACKGROUND ART

WO2011/053635 discloses light-emitting diode (LED) devices comprising compositions and containers of hermetically sealed nano-sized luminescent crystals ("LCs").

WO2017/106979 discloses luminescent components comprising luminescent crystals in a first polymer and encapsulated in a polymer or inorganic matrix. WO2018/028869 discloses luminescent materials from the class of perovskite crystals and the manufacturing thereof.

US20180298278 discloses a composite luminescent material comprising perovskite nanoparticles dispersed in a specific matrix. The document aims to improve drawbacks of known composite luminescent materials, such as low Quantum Yield and low stability and suggests overcoming them by improved manufacturing methods. Although suitable, the manufacturing methods disclosed are difficult to implement on a commercial scale and Quantum Yield and Stability are still considered insufficient.

DISCLOSURE OF THE INVENTION

Known luminescent components, particularly when comprising LCs of the perovskite structure, may comprise barrier films to improve stability against oxygen or humidity. Although suitable for many applications, it was found that these luminescent components and lighting devices lack stability, particularly in view of high temperature and high humidity and blue light radiation.

Thus, it is an object of the present invention to mitigate at least some of these drawbacks of the state of the art. In particular, it is an aim of the present invention to provide improved luminescent components that are highly luminescent and at the same time show improved stability, particularly towards temperature and humidity and blue light radiation. It is a further aim to provide new lighting devices and manufacturing methods for such components and devices, particularly manufacturing methods suited for commercial production.

These objectives are achieved by a luminescent component, lighting devices and, manufacturing methods as described herein. Further aspects of the invention are disclosed in the specification and independent claims, preferred embodiments are disclosed in the specification and the dependent claims. The invention particularly provides for:
- luminescent components and its uses ($1^{st}$ aspect);
- lighting devices ($2^{nd}$ aspect)
- manufacturing of luminescent components and devices ($3^{rd}$ aspect).

The present invention will be described in detail below. It is understood that the various embodiments, preferences and ranges as provided/disclosed in this specification may be combined at will. Further, depending of the specific embodiment, selected definitions, embodiments or ranges may not apply.

Unless otherwise stated, the following definitions shall apply in this specification:

The terms "a", "an" "the" and similar terms used in the context of the present invention are to be construed to cover both the singular and plural unless otherwise indicated herein or clearly contradicted by the context. The term "containing" shall include all, "comprising", "essentially consisting of" and "consisting of". Percentages are given as weight-%, unless otherwise indicated herein or clearly contradicted by the context. "Independently" means that one substituent/ion may be selected from one of the named substituents/ions or may be a combination of more than one of the above.

The term "luminescent crystal" (LC) is known in the field and relates to (i) crystals of 3-100 nm, made of semiconductor materials and (ii) crystals of micron-sized phosphors. The term comprises quantum dots, typically in the range of 3-15 nm and nanocrystals, typically in the range of more than 15 nm and up to 100 nm (preferably up to 50 nm). Preferably, luminescent crystals are approximately isometric (such as spherical or cubic). Particles are considered approximately isometric, in case the aspect ratio (longest: shortest direction) of all 3 orthogonal dimensions is 1-2. Accordingly, an assembly of LCs preferably contains 50-100% (n/n), preferably 66-100% (n/n) much preferably 75-100% (n/n) isometric nanocrystals.

LCs show, as the term indicates, luminescence. In the context of the present invention the term luminescent crystal includes both, single crystals and polycrystalline particles. In the latter case, one particle may be composed of several crystal domains (grains), connected by crystalline or amorphous phase boundaries.

If the luminescent crystal is selected from a semiconducting material, it exhibits a direct bandgap (typically in the range 1.1-3.8 eV, more typically 1.4-3.5 eV, even more typically 1.7-3.2 eV). Upon illumination with electromagnetic radiation equal or higher than the bandgap, the valence band electron is excited to the conduction band leaving an electron hole in the valence band. The formed exciton (electron-electron hole pair) then radiatively recombines in the form of photoluminescence, with maximum intensity centered around the LC bandgap value and exhibiting photoluminescence quantum yield of at least 1%. In contact with external electron and electron hole sources LC could exhibit electroluminescence. In the context of the present invention LCs do not exhibit mechanoluminescence (e.g. piezoluminescence), chemiluminescence, electrochemi-luminescence nor thermoluminescence.

The term "quantum dot" (QD) is known and particularly relates to semiconductor nanocrystals, which have a diameter typically between 3-15 nm. In this range, the physical radius of the QD is smaller than the bulk excitation Bohr radius, causing quantum confinement effect to predominate. As a result, the electronic states of the QD, and therefore the bandgap, are a function of the QD composition and physical size, i.e. the color of absorption/emission is linked with the QD size. The optical quality of the QDs sample is directly linked with their homogeneity (more monodisperse QDs will have smaller FWHM of the emission). When QD reach size bigger than the Bohr radius the quantum confinement effect is hindered and the sample may not be luminescent anymore as nonradiative pathways for exciton recombination may become dominant. Thus, QDs are a specific subgroup of nanocrystals, defined in particular by its size and size distribution.

The term "perovskite crystals" is known and particularly includes crystalline compounds of the perovskite structure. Such perovskite structures are known per se and described as cubic, pseudocubic, tetragonal or orthorhombic crystals. The manufacturing of such luminescent crystals is known, e.g. from WO2018 028869.

The term "polymer" is known and includes organic and inorganic synthetic materials comprising repeating units ("monomers"). The term polymers includes homo-polymers and co-polymers. Further, cross-linked polymers and non-crosslinked polymers are included. Depending on the context, the term polymer shall include its monomers and oligomers. Polymers include, by way of example, acrylate polymers, carbonate polymers, sulfone polymers, epoxy polymers, vinyl polymers, urethane polymers, imide polymers, ester polymers, furane polymers, melamine polymers, styrene polymers, norbornene polymers, silicone polymers and cyclic olefin copolymers. Polymers may include, as conventional in the field, other materials such as polymerization initiators, stabilizers, fillers, solvents.

Polymers may be further characterized by physical parameters, such as polarity, glass transition temperature Tg, Young's modulus and light transmittance.

Transmittance: Typically, polymers used in the context of this invention are light transmissive for visible light, i.e. non-opaque for allowing light emitted by the luminescent crystals, and possible light of a light source used for exciting the luminescent crystals to pass. Light transmittance may be determined by white light interferometry or UV-Vis spectrometry.

Glass transition temperature: (Tg) is a well-established parameter in the field of polymers; it describes the temperature where an amorphous or semi-crystalline polymer changes from a glassy (hard) state to a more pliable, compliant or rubbery state. Polymers with high Tg are considered "hard", while polymers with low Tg are considered "soft". On a molecular level, Tg is not a discrete thermodynamic transition, but a temperature range over which the mobility of the polymer chains increase significantly. The convention, however, is to report a single temperature defined as the midpoint of the temperature range, bounded by the tangents to the two flat regions of the heat flow curve of the DSC measurement. Tg may be determined according to DIN EN ISO 11357-2 or ASTM E1356 using DSC. This method is particularly suitable if the polymer is present in the form of bulk material. Alternatively, Tg may be determined by measuring temperature-dependent micro- or nanohardness with micro- or nanoindentation according to ISO 14577-1 or ASTM E2546-15. This method is suited for luminescent components and lighting devices as disclosed herein. Suitable analytical equipment is available as MHT (Anton Paar), Hysitron TI Premier (Bruker) or Nano Indenter G200 (Keysight Technologies). Data obtained by temperature controlled micro- and nanoindentation can be converted to Tg. Typically, the plastic deformation work or Young's modulus or hardness is measured as a function of temperature and Tg is the temperature where these parameters change significantly. Young's modulus or Young modulus or Elasticity modulus is a mechanical property that measures the stiffness of a solid material. It defines the relationship between stress (force per unit area) and strain (proportional deformation) in a material in the linear elasticity regime of a uniaxial deformation.

The term "matrix" is known in the field and in the context of this invention denotes continuous phase encompassing a discontinuous or particulate phase. The continuous material thereby encapsulating the particulate phase.

The term "solvent" is known in the field and particularly includes aliphatic hydrocarbons, aromatic hydrocarbons, ethers (including glycol-ethers), esters, alcohols, ketones, amines, amides, sulfones, phosphines, alkylcarbonates. The above organics can be substituted or unsubstituted by one or more substituents, for example by halogen (such as fluoro, chloro, iodo or bromo), Hydroxy, $C_{1-4}$ alkoxy (such as methoxy or ethoxy) and alkyl (such as methyl, ethyl, isopropyl). The above organics include linear, branched and cyclic derivatives. There can also be unsaturated bonds in the molecule. The above compounds typically have 4-24 carbon atoms, preferably 8-22 carbon atoms, most preferably 12-20 carbon atoms.

The terms "surfactant", "ligand", "dispersant" and "dispersing agent" are known in the field and have essentially the same meaning. In the context of the present invention, these terms denote an organic substance, other than a solvent, which is used in suspensions or colloids to improve the separation of particles and to prevent agglomeration or settling. Without being bound to theory, it is believed that surfactants are physically or chemically attached on the particle surface either before or after adding the particles to the solvent and thereby provide the desired effects. The term surfactants includes polymer materials and small molecules; surfactants typically contain polar functional end-groups and apolar end-groups. In the context of the present invention, solvents (e.g. toluene) are not considered surfactants.

The term "suspension" is known and relates to a heterogeneous fluid of an internal phase (i.p.) that is a solid and an external phase (e.p.) that is a liquid. The external phase comprises one or more dispersants/surfactants, optionally one or more solvents and optionally one or more pre-polymers.

The term "solution-processing" is known in the field and denotes the application of a coating or thin film to a substrate by the use of a solution-based (=liquid) starting material. In the context of the present invention, solution processing relates to the fabrication of commercial products, such as electronic devices, optical devices, and articles comprising (decorative) coatings and also to the fabrication of components/intermediate goods comprising a LC composite or LC layer. Typically—the application of the suspension(s) is/are conducted at ambient conditions.

According to a first aspect of the present invention, a luminescent component 4 is provided. The luminescent component comprises a first element 1 including first luminescent crystals 11 from the class of perovskite crystals, embedded a first polymer P1 and a second element 2 comprising a second solid polymer composition, said second polymer composition optionally comprising second luminescent crystals 12 embedded in a second polymer P2. According to this invention, P1 and P2 differ.

In an embodiment the invention provides a luminescent component 4 comprising a 1st element 1 and a 2nd element 2.

Said first element 1 comprises a first solid polymer composition, said first polymer composition comprising first luminescent crystals 11 embedded in a first polymer P1. Said first luminescent crystals are of the perovskite crystal structure and emit light of a first wavelength in response to excitation by light with a wavelength shorter than the first wavelength. Said first polymer P1 is selected from the group of polymers with $T_g$<95° C. (preferably <90° C., preferably <80° C., most preferably <70° C.)

Said second element 2 comprises a second solid polymer composition optionally comprising second luminescent crystals 12 embedded in a second polymer P2. Said optional second luminescent crystals 12 are different from said first luminescent crystals 11 and emit light of a second wavelength in response to excitation by light with a wavelength shorter than the second wavelength. Said second polymer P2 is selected from the group of crosslinked polymers with $T_g$>115° C. (preferably >120° C., preferably >130° C., preferably >140° C., most preferably >150° C.). The second element at least partially covers and thereby seals the first element.

Each Tg is determined by DSC according to DIN EN ISO 11357-2:2014-07 with a starting temperature of −90° C. and an end temperature of 250° C. and a heating rate of 20 K/min in nitrogen (5.0) atmosphere (20 ml/min). The purging gas is nitrogen (5.0) at 20 ml/min. The $T_g$ is determined during the second heating cycle.

In an embodiment the invention provides a luminescent component 4 comprising a 1st element 1 and a 2nd element 2. Said first element 1 comprises a first solid polymer composition, said first polymer composition comprising first luminescent crystals 11 embedded in a first polymer P1. Said first luminescent crystals are of the perovskite crystal structure and emit light of a first wavelength in response to excitation by light with a wavelength shorter than the first wavelength. Said first polymer P1 is selected from the group of polymers with $T_g$<120° C. (preferably <110° C., preferably <100° C., most preferably <90° C.) Said second element 2 comprises a second solid polymer composition optionally comprising second luminescent crystals 12 embedded in a second polymer P2. Said optional second luminescent crystals 12 are different from said first luminescent crystals 11 and emit light of a second wavelength in response to excitation by light with a wavelength shorter than the second wavelength. Said second polymer P2 is selected from the group of crosslinked polymers with $T_g$>140° C. (preferably >150° C., preferably >160° C., preferably >160° C., most preferably >170° C.). The second element at least partially covers and thereby seals the first element.

Each Tg is determined by DSC according to DIN EN ISO 11357-2:2014-07 with a starting temperature of −90° C. and an end temperature of 250° C. and a heating rate of 20 K/min in nitrogen (5.0) atmosphere (20 ml/min). The purging gas is nitrogen (5.0) at 20 ml/min. The $T_g$ is determined during the second heating cycle.

In an embodiment the invention provides a luminescent component 4 comprising a 1st element 1 and a 2nd element 2.

Said first element 1 comprises a first solid polymer composition, said first polymer composition comprising first luminescent crystals 11 embedded in a first polymer P1. Said first luminescent crystals are of the perovskite crystal structure and emit light of a first wavelength in response to excitation by light with a wavelength shorter than the first wavelength. Said first polymer P1 is selected from the group of polymers with $T_g$<95° C. (preferably <90° C., preferably <80° C., most preferably <70° C.)

Said second element 2 comprises a second solid polymer composition optionally comprising second luminescent crystals 12 embedded in a second polymer P2. Said optional second luminescent crystals 12 are different from said first luminescent crystals 11 and emit light of a second wavelength in response to excitation by light with a wavelength shorter than the second wavelength. Said second polymer P2 is selected from the group of polymers with WVTR<1 (g*mm)/(m2*day) (preferably <0.5, more preferably <0.2 (g*mm)/(m2*day)). The second element at least partially covers and thereby seals the first element.

In this embodiment, the polymer P2 may or may not be crosslinked, preferably P2 is not a crosslinked polymer.

Each Tg is determined by DSC according to DIN EN ISO 11357-2:2014-07 with a starting temperature of −90° C. and an end temperature of 250° C. and a heating rate of 20 K/min in nitrogen (5.0) atmosphere (20 ml/min). The purging gas is nitrogen (5.0) at 20 ml/min. The $T_g$ is determined during the second heating cycle.

Each WVTR is determined by ISO 15106-3:2003 at a temperature/relative humidity of 40° C./90% r.h.

In an embodiment the invention provides a luminescent component 4 comprising a 1st element 1 and a 2nd element 2. Said first element 1 comprises a first solid polymer composition, said first polymer composition comprising first luminescent crystals 11 embedded in a first polymer P1. Said first luminescent crystals are of the perovskite crystal structure and emit light of a first wavelength in response to excitation by light with a wavelength shorter than the first wavelength. Said first polymer P1 is selected from the group of polymers with $T_g$<120° C. (preferably <110° C., preferably <100° C., most preferably <90° C.) Said second element 2 comprises a second solid polymer composition optionally comprising second luminescent crystals 12 embedded in a second polymer P2. Said optional second luminescent crystals 12 are different from said first luminescent crystals 11 and emit light of a second wavelength in response to excitation by light with a wavelength shorter than the second wavelength. Said second polymer P2 is selected from the group of polymers with WVTR<1 (g*mm)/(m2*day) (preferably <0.5, more preferably <0.2 (g*mm)/(m2*day)). The second element at least partially covers and thereby seals the first element.

In this embodiment, P2 is preferably not a crosslinked polymer.

Each Tg is determined by DSC according to DIN EN ISO 11357-2:2014-07 with a starting temperature of −90° C. and an end temperature of 250° C. and a heating rate of 20 K/min in nitrogen (5.0) atmosphere (20 ml/min). The purging gas is nitrogen (5.0) at 20 ml/min. The $T_g$ is determined during the second heating cycle.

Each WVTR is determined by ISO 15106-3:2003 at a temperature/relative humidity of 40° C./90% r.h.

It is preferred that the first element does not spontaneously emit light of a wavelength but does so in response to an excitation, and in particular in response to an excitation with light of a wavelength shorter than the wavelength of the light to be emitted in response to the excitation. Hence, in a preferred embodiment, the first element emits light of a first wavelength, e.g. light in the green spectrum in response to an excitation with e.g. light in the blue spectrum.

The second element may or may not comprise luminescent crystals. If it comprises luminescent crystals, it is preferred that the second element does not spontaneously emit light of a wavelength but does so in response to an excitation, and in particular in response to an excitation with light of a wavelength shorter than the wavelength of the light to be emitted in response to the excitation. Hence, in a preferred embodiment, the second element emits light of a second wavelength, e.g. light in the red spectrum in response to an excitation with e.g. light in the blue spectrum.

It is preferred that P1 and P2 do not dissolve with each other when in contact, at least when in contact in the solid phase at room temperature. As a consequence, first and second element remain as distinct phases with one or more phase boundaries within the luminescent component 4. The first element and the second element thus possess individual surfaces. By selecting the respective polymer materials appropriately, the first luminescent crystals are confined in the first element and cannot interact with other components outside the first element or the environment, e.g. air, water, further luminescent crystals.

It was found that such luminescent component simultaneously shows good stability towards light radiation (especially blue light radiation) and good stability towards temperature and humidity. This is considered a significant improvement over the prior art. Known luminescent components show good stability towards light radiation but fail in view of stability towards temperature and humidity. Likewise, luminescent components are known that show good stability towards temperature and humidity but fail in view of stability towards light radiation. Meeting both criteria for stability, i.e. photo stability on the one side and temperature/humidity stability on the other side, is a significant achievement that allows manufacturing of improved luminescent components and lighting devices of superior quality. Without being bound to theory, it is believed that the first element provides an encapsulation having soft mechanical properties (defined by the low Tg and/or E-module of P1) while the second element provides a sealing polymer with hard mechanical properties (defined by the high Tg and/or E-module of P2).

In view of the above, the invention also pertains to the use of a polymer P2 in a luminescent component 4 whereby said polymer P2 is selected from the group of crosslinked polymers with $T_g$>115° C. (preferably >120° C., preferably >130° C., preferably >140° C., most preferably >150° C.) and said luminescent component comprises luminescent crystals 11 of the perovskite crystal structure embedded in a polymer P1 with $T_g$<95° C. (preferably <90° C., preferably <80° C., most preferably <70° C.)

In view of the above, the invention also pertains to the use of a polymer P2 in a luminescent component 4 whereby said polymer P2 is selected from the group of crosslinked polymers with $T_g$>140° C. (preferably >150° C., preferably >160° C., preferably >170° C., most preferably >180° C.) and said luminescent component comprises luminescent crystals 11 of the perovskite crystal structure embedded in a polymer P1 with $T_g$<120° C. (preferably <110° C., preferably <100° C., most preferably <100° C.)

In view of the above, the invention also pertains to the use of a polymer P2 in a luminescent component 4 whereby said polymer P2 is selected from the group of polymers with WVTR<1 (g*mm)/(m2*day) (preferably <0.5, more preferably <0.2 (g*mm)/(m2*day)) and said luminescent component comprises luminescent crystals 11 of the perovskite crystal structure embedded in a polymer P1 with $T_g$<95° C. (preferably <90° C., preferably <80° C., most preferably <70° C.) In this embodiment, P2 is preferably not a crosslinked polymer.

In view of the above, the invention also pertains to the use of a polymer P2 in a luminescent component 4 whereby said polymer P2 is selected from the group of polymers with WVTR<1 (g*mm)/(m2*day) (preferably <0.5, more preferably <0.2 (g*mm)/(m2*day)) and said luminescent component comprises luminescent crystals 11 of the perovskite crystal structure embedded in a polymer P1 with $T_g$<120° C. (preferably <110° C., preferably <100° C., most preferably <90° C.). In this embodiment, P2 is preferably not a crosslinked polymer.

Also provided is the use of a luminescent component 4, for emitting white light in response to the luminescent component 4 being radiated by blue light, in particular as a backlight in a liquid crystal display.

This aspect of the invention, particularly the chemical compositions of first polymer, second polymer, luminescent crystals as well as suitable architectures of such luminescent components are explained in further detail below.

First Polymer: The first solid polymer composition comprises first luminescent crystals embedded in a first polymer (P1). Said first polymer (P1) may be selected from a large variety of polymers as described herein. These may include acrylate polymers, carbonate polymers, vinyl polymers, urethane polymers, ester polymers, styrene polymers, olefin polymers, silicone polymers, cyclic olefin copolymers.

In embodiments of the invention the first polymer P1 has a glass transition temperature 50° C.<$T_g$<95° C., preferably 50° C.<$T_g$<90° C., preferably 50° C.<$T_g$<80° C., most preferably 50° C.<$T_g$<70° C. Accordingly, P1 may be considered a "soft" polymer, particularly when compared to P2.

In embodiments of the invention the first polymer (P1) is transmissive to visible light with a transmittance of >70%, preferably >80%, most preferably >90% at a thickness of 100 µm.

In embodiments of the invention the first polymer (P1) is amorphous (not crystalline; not semi-crystalline).

In embodiments of the invention the first polymer (P1) is a crosslinked polymer. Crosslinking is the general term for the process of forming covalent bonds or relatively short sequences of chemical bonds to join two polymer chains together. Crosslinked polymers cannot be dissolved in a solvent without destroying covalent bonds by e.g. oxidation in an oxidizing solvent. However, crosslinked polymers might swell when subjected to a solvent. In the case of acrylates, crosslinking can be obtained for example by curing a mixture of at least 0.5 wt % difunctional and/or multi-functional acrylate pre-polymer with a monofunctional acrylate pre-polymer.

In embodiments of the invention the first polymer (P1) has a molar ratio of the sum of (oxygen+nitrogen+sulphur+phosphorous+fluorine+chlorine+bromine+iodine) to carbon<0.9, preferably <0.4, preferably <0.3, most preferably <0.25.

In embodiments of the invention the first polymer (P1) has a water vapour transmission rate (WVTR) expressed in (g*mm)/(m2*day) at a temperature/relative humidity of 40° C./90% r.h. of WVTR<1 (g*mm)/(m2*day), preferably <0.5 (g*mm)/(m2*day), most preferably <0.2 (g*mm)/(m2*day).

In embodiments of the invention the first polymer (P1) has an oxygen transmission rate (OTR) expressed in $(cm^3*mm)/(m^2*day*atm)$ at a temperature/rel. humidity of 23° C./0% r.h. of OTR>1$(cm^3*mm)/(m^2*day*atm)$, preferably >5$(cm^3*mm)/(m^2*day*atm)$, preferably >25$(cm^3*mm)/(m^2*day*atm)$, most preferably >125$(cm^3*mm)/(m^2*day*atm)$.

In embodiments of the invention the first polymer (P1) is selected from the group of acrylate polymers; preferably crosslinked acrylate polymers and the second polymer (P2) is preferably selected from the group of acrylate polymers;

preferably crosslinked acrylate polymers. Crosslinked acrylates are obtained for example by using a difunctional and/or multi-functional pre-polymer with at least 0.5 wt % in a monofunctional acrylate.

In one preferred embodiment of the invention the first polymer (P1) is an acrylate. Advantageously, the first polymer contains (ie. comprises or consists of) repeating units of mono-functional acrylates (III) and repeating units of multi-functional acrylates (V). As the term implies, mono-functional acrylates comprise one acrylate functionality while multi-functional acrylates comprise 2, 3, 4, 5 or 6 acrylate functionalities. As used herein, the term acrylates also includes (Meth)acrylates. The amount of mono-functional acrylate repeating units (III) and multifunctional acrylate repeating units (V) may vary over a broad range. Suitable are, for example, first polymers comprising 10-90 wt %, preferably 50-80 wt %, monofunctional acrylate repeating units. Suitable are, for example, first polymers comprising 10-90 wt %, preferably 20-50 wt %, multifunctional acrylate repeating units.

In one preferred embodiment the repeating units comprise mono-functional acrylates of formula (III)

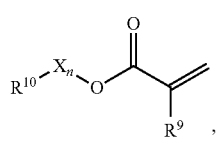
(III)

wherein:
$R^9$ represents H or $CH_3$,
$R^{10}$ represents a cyclic, linear or branched $C_{1-25}$ alkyl, or a $C_{6-26}$ aryl group, each optionally substituted with one or more cyclic, linear or branched $C_{1-20}$ alkyl, phenyl or phenoxy,
n represents 0 or 1, and
X represents a spacer from the group of alkoxylates comprising 1-8 carbon atoms and 1-4 oxygen atoms.

The term cyclic $C_{x-y}$ alkyl group shall include monocyclic and polycyclic groups, including fused ring systems comprising x-y carbon atoms as ring members. Cyclic alkyl groups may also include groups with one double bond.

Compounds of formula (III) include acrylates of formulae (III-1) and (III-2) where $R^9$ is H, and Methacrylates of formula (III-3) and (III-4) where $R^9$ is Methyl, collectively also termed acrylates.

Further, compounds of formula (III) also include simple acrylates where n is 0 and X is not present, formulae (III1) and (III-3):

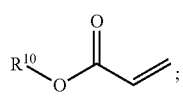
(III-1)

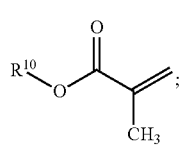
(III-3)

where $R^{10}$ is as defined above.

Further, compounds of formula (III) also include alkoxylated acrylates, formulae (III-2) and (III-4):

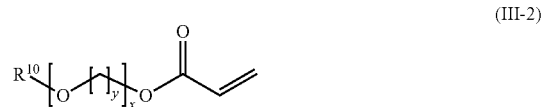
(III-2)

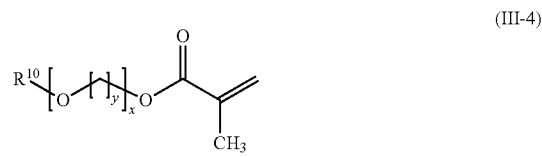
(III-4)

where $R^{10}$ is as defined above.

$R^{10}$ preferably represents a cyclic $C_{5-25}$ alkyl, an acyclic (linear or branched) $C_{1-25}$ alkyl, or a $C_{6-26}$ aryl, each optionally substituted with one or more cyclic, linear or branched $C_{1-20}$ alkyl, phenyl or phenoxy, $R^{10}$ more preferably represents a saturated cyclic $C_{5-25}$ alkyl group, whereby cyclic alkyl includes mono-cyclic and poly-cyclic groups optionally substituted by 1-6 substituents, each substituent independently selected from $C_{1-4}$ alkyl.

$R^{10}$ most preferably represents a saturated poly-cyclic $C_{6-25}$ alkyl group, substituted by 1-6 substituents, each substituent independently selected from $C_{1-4}$ alkyl.

$R^{10}$ further most preferably represents a saturated poly-cyclic $C_{8-25}$ alkyl group optionally comprising 1-6 substituents, each substituent independently selected from $C_{1-4}$ alkyl.

Specific examples of $R^{10}$ include isobornyl, dicyclopentanyl, 3,3,5-trimethyl cyclohexyl, 4-tert-butylcyclohexyl acrylate.

Specific examples of acrylates of formula (III-1) and (III-3) include: isobornylacrylate (CAS 5888-33-5), isobornylmethacrylate (CAS 7534-94-3), dicyclopentanyl-acrylate (CAS 79637-74-4, FA-513AS (Hitachi Chemical, Japan)), dicyclopentanyl-methacrylate (CAS 34759-34-7, FA-513M (Hitachi Chemical, Japan)), 3,3,5-trimethyl cyclohexyl acrylate (CAS 86178-38-3), 3,3,5-trimethyl cyclohexyl methacrylate (CAS 7779-31-9), 4-tert-butylcyclohexyl acrylate (CAS 84100-23-2), 4-tert-Butylcyclohexyl methacrylate (CAS 46729-07-1).

Specific examples of acrylates of formula (III-2) and (III-4) include: poly(ethylene glycol) phenyl ether acrylates (specifically 2-phenoxyethyl acrylate), O-phenyl phenoxyethyl acrylate, Polyethylene glycol o-phenylphenyl ether acrylate (CAS 72009-86-0), poly(ethylene glycol) ethyl ether methacrylate, Di(ethylene glycol) ethyl ether acrylate, Poly(ethylene oxide) nonylphenyl etheracrylate, Poly(propylene glycol) 4-nonylphenyl ether acrylate, Ethylene glycol dicyclopentenyl ether acrylate, Ethylene glycol dicyclopentenyl ether methacrylate.

In one preferred embodiment the multifunctional units comprise di-functional acrylates of formula (V)

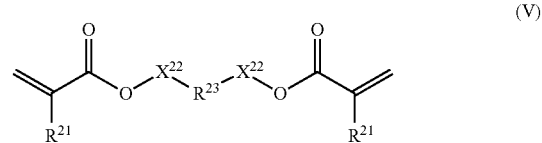
(V)

wherein

R²¹ independently from each other represent H or CH₃;

R²³ represents a cyclic, linear or branched C₁₋₂₅ alkyl, or a C₆₋₂₆ aryl group, each optionally substituted with one or more cyclic, linear or branched C₁₋₂₀ alkyl, phenyl or phenoxy;

X²² independently from each other represent a spacer selected from the group of alkoxylates, whereby both substituents X²² together comprise 8-40 carbon atoms and 2-20 oxygen atoms.

R²³ preferably represents a C₆₋₂₆ aryl group optionally substituted with one or more cyclic, linear or branched C₁₋₂₀ alkyl, phenyl or phenoxy.

R²³ particularly preferably represents a C₆₋₂₆ aryl group, optionally substituted with one or more cyclic, linear or branched C₁₋₂₀ alkyl. Aryl includes mono-cyclic and poly-cyclic aryls which may optionally be substituted by 1-4 substituents, said substituents being selected from the group of C₁₋₄ alkyl, phenyl and phenoxy.

R²³ particularly preferably represents phenyl, benzyl, 2-naphtyl, 1-naphtyl, 9-fluorenyl.

R²³ most preferably represents bisphenol A or fluorene-9-bisphenol.

X²² preferably represents a spacer selected from the group of ethoxylates and/or isopropoxylates whereby both substituents X²² together comprise 8-24 carbon atoms and 4-8 oxygen atoms.

X²² most preferably represents a spacer selected from the group of ethoxylates and/or isopropoxylates whereby both substituents X²² together comprise 4-20 carbon atoms and 2-10 oxygen atoms.

A preferred group of diacrylates are of formula (V-1)

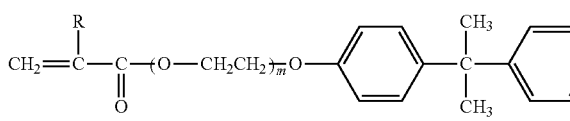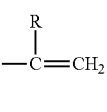 (V-1)

wherein R represents H or CH₃ and m+n is between 4 and 10.

Specific examples of di-functional acrylates include 1,10-decanediol diacrylate, 1,6-hexanediol diacrylate, 1,6-hexanediol dimethacrylate, Neopentyl glycol dimethacrylate, tricyclodecane dimethanol diacrylate, Bisphenol A ethoxylate diacrylate (including CAS 64401-02-1, such as Miramer M240 (Miwon Korea), Miramer M2100 (Miwon Korea), Fancryl FA-324A (Hitachi Chemical, Japan), Fancryl FA-326A (Hitachi Chemical, Japan), Fancryl FA-328A (Hitachi Chemical, Japan), Fancryl FA-321A (Hitachi Chemical, Japan)). Bisphenol A ethoxylate dimethacrylate (such as Miramer M241 (Miwon Korea), Miramer M2101 (Miwon Korea), Fancryl FA-324M (Hitachi Chemical, Japan), Fancryl FA-326M (Hitachi Chemical, Japan), Fancryl FA-328M (Hitachi Chemical, Japan) Fancryl FA-321M (Hitachi Chemical, Japan)), modified fluorene-9-bisphenol diacrylate (CAS, modified fluorine-9-bisphenol dimethacrylate.

Specific examples of trifunctional acrylates include ethoxylated trimethylolpropane triacrylate (CAS28961-43-5), isopropoxylated trimethylolpropane triacrylate (CAS53879-54-2), isopropoxylated glycerine triacrylate (CAS52408-84-1).

Specific examples of tetrafunctional acrylates include Di(trimethylolpropane) tetraacrylate (CAS94108-97-1), ethoxylated pentaerythritol tetraacrylate (CAS51728-26-8).

Specific examples of pentafunctional acrylates include Dipentaeritritol pentaacrylate (CAS 60506-81-2).

Specific examples of hexafunctional acrylates include Dipentaerythritol hexaacrylate (CAS 29570-58-9).

Second Polymer: The second solid polymer composition optionally comprises second luminescent crystals embedded in a second polymer (P2). Said second polymer (P2) may be selected from a large variety of polymers as described herein.

In embodiments of the invention the second polymer (P2) has a glass transition temperature $T_g$>115° C. preferably >120° C., preferably >130° C., preferably >140° C., most preferably >150° C. P2 may be considered a "hard" polymer, particularly when compared to P1.

In embodiments of the invention the second polymer (P2) is transmissive to visible light with a transmittance of >70%, preferably >80%, most preferably >90% at a thickness of 100 μm, the term light transmittance being defined above.

In embodiments of the invention the second polymer (P2) is amorphous (not crystalline; not semi-crystalline).

In embodiments of the invention the second polymer (P2) is a crosslinked polymer. The term crosslinked is described above.

In embodiments of the invention the second polymer (P2) has a molar ratio of the sum of (oxygen+nitrogen+sulphur+phosphorous+fluorine+chlorine+bromine+iodine) to carbon<0.9, preferably <0.4, preferably <0.3, most preferably <0.20.

In embodiments of the invention the second polymer (P2) has a water vapour transmission rate of rate (WVTR) expressed in (g*mm)/(m2*day) at a temperature/relative humidity of 40° C./90% r.h. of WVTR<1 (g*mm)/(m2*day), preferably <0.5 (g*mm)/(m2*day), most preferably <0.2 (g*mm)/(m2*day).

In embodiments of the invention the second polymer (P2) has an oxygen transmission rate of (OTR) expressed in (cm3*mm)/(m2*day*atm) at a temperature/relative humidity of 23° C./0% r.h. of OTR<50 (cm3*mm)/(m2*day*atm), preferably <10(cm³*mm)/(m²*day*atm), more preferably <5(cm³*mm)/(m²*day*atm), most preferably <1(cm³*mm)/(m²*day*atm).

In embodiments of the invention the second polymer (P2) has an oxygen transmission rate (OTR) expressed in (cm3*mm)/(m2*day*atm) at a temperature/relative humidity of 23° C./0% r.h. of OTR>1 (cm3*mm)/(m2*day*atm), preferably >5 (cm3*mm)/(m2*day*atm), more preferably >25 (cm3*mm)/(m2*day*atm).

In an alternative embodiment the second polymer (P2) has an oxygen transmission rate (OTR) expressed in (cm3*mm)/(m2*day*atm) at a temperature/relative humidity of 23° C./0% r.h. of OTR>125 (cm3*mm)/(m2*day*atm).

As discussed above, a large variety of polymers is suitable as a second polymer in the context of the present invention. Suitable second polymers (P2) include acrylate polymers, carbonate polymers, sulfone polymers, phenylene-oxide polymers, epoxy polymers, vinyl polymers, urethane polymers, ester polymers, styrene polymers, imide polymers, norbornene polymers and cyclic olefin copolymers. Particularly suitable polymers P2 include epoxy polymers, urethane polymers and acrylate polymers and norbornene polymers and cyclic olefin copolymers or co-polymers thereof and mixtures (blends) thereof.

In one preferred embodiment of the invention the second polymer (P2) is an acrylate. In an embodiment, the second polymer contains repeating units of mono-functional acrylates (III). Advantageously, the second polymer optionally contains repeating units of mono-functional acrylates (III) and repeating units of multi-functional acrylates (VI); multi-functional acrylates of P2 may comprise 2, 3, 4, 5 or 6 acrylate functionalities.

The monofunctional units exhibit formula (III) as specified above. In the context of P2, acrylates of formulae (III-1) and (III-3) are preferred.

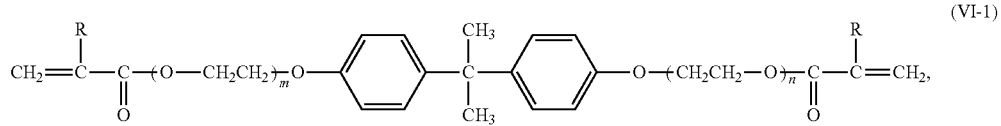

(VI-1)

In the context of P2, substituent $R^{10}$ preferably represents a cyclic alkyl group with $C_{5-25}$. Cyclic alkyl includes monocyclic and poly-cyclic groups and also includes optionally substituted groups, comprising 1-6 substituents from the group of $C_{1-4}$ alkyl.

In the context of P2, substituent $R^{10}$ more preferably represents a poly-cyclic alkyl group with $C_{5-25}$ and an unsaturated double bond on the cyclic ring including substituted groups, comprising 1-6 substituents from the group of $C_{1-4}$ alkyl.

In the context of P2, substituent $R^{10}$ even more preferably represents isobornyl, dicyclopentanyl (di-cp), 3,3,5-trimethyl cyclohexyl, 4-tert-butylcyclohexyl.

In the context of P2, $R^{10}$ particularly preferably is dicyclopentenyl.

In the context of P2, specific examples of acrylates (III) include: isobornylacrylate (CAS 5888-33-5), isobornyl-methacrylate (CAS 7534-94-3), dicyclopentanyl-acrylate (CAS 79637-74-4, FA-513AS (Hitachi Chemical, Japan)), dicyclopentanyl-methacrylate (CAS 34759-34-7, FA-513M (Hitachi Chemical, Japan)), dicyclopentenyl-acrylate (CAS 33791-58-1, FA-511AS (Hitachi Chemical, Japan)), dicyclopentenyl-methacrylate (CAS 31621-69-9), 3,3,5-trimethyl cyclohexyl acrylate (CAS 86178-38-3), 3,3,5-trimethyl cyclohexyl methacrylate (CAS 7779-31-9), 4-tert-butylcyclohexyl acrylate (CAS 84100-23-2), 4-tert-butylcyclohexyl methacrylate (CAS 46729-07-1).

In one preferred embodiment the multifunctional units comprise difunctional acrylates of formula (VI)

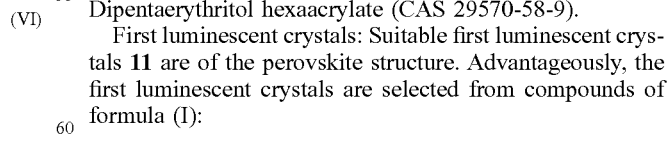

(VI)

wherein:
$R^{31}$ independently from each other represent H or $CH_3$;
$R^{33}$ represents a cyclic $C_{5-25}$ alkyl, or a $C_{6-26}$ aryl group, each optionally substituted with one or more cyclic, linear or branched $C_{1-20}$ alkyl, phenyl or phenoxy;

$X^{32}$ are independent from each other and are either not present (R33 directly bound to the oxygen by a single bond) or represent a spacer from the group of alkoxylates, whereby both substituents $X^{32}$ together comprise 1-8 carbon atoms and 1-8 oxygen atoms.

$R^{33}$ preferably represents a group as defined above for $R^{32}$.

$R^{33}$ most preferably represents bisphenol A or fluorene-9-bisphenol.

$X^{32}$ preferably represents a single bond, thereby directly connecting $R^{33}$ to the adjacent oxygen.

$X^{32}$ preferably represents a spacer from the group of ethoxylates and/or isopropoxylates, whereby both substituents $X^{32}$ together 1-6 carbon atoms and 1-6 oxygen atoms.

A preferred group of diacrylates are of formula (VI-1)

wherein R represents H or $CH_3$ and m+n is between 0 and 3.

Specific examples of difunctional acrylates include bisphenol A ethoxylate diacrylate (including CAS 24447-78-7, Fancryl FA-320A (Hitachi Chemical, Japan)), bisphenol A ethoxylate diacrylate (including CAS 64401-02-1, Fancryl FA-320AP (Hitachi Chemical, Japan)), tricyclodecan dimethanol diacrylate (CAS 42594-17-2, Miramer M262 (Miwon, Korea)), bisphenol A ethoxylate dimethacrylate (CAS 24448-20-2, Fancryl FA-320M (Hitachi Chemicla, Japan), bisphenol A ethoxylate dimethacrylate (CAS 41637-38-1 Fancryl FA-320MP (Hitachi Chemical, Japan)).

In one preferred embodiment the multifunctional units comprise tri-, tetra, penta-, and hexafunctional acrylates. These multifunctional acrylates increase the crosslinking density and are able to increase the desired barrier properties of the second polymer.

Specific examples of trifunctional acrylates include trimetylolpropane triacrylate (CAS 15625-89-5), ethoxylated trimethylolpropane triacrylate (CAS 28961-43-5), Tris (2-Hydroxy ethyl) Isocyanurate Triacrylate (CAS 40220-08-4).

Specific examples of tetrafunctional acrylates include Di(trimethylolpropane) tetraacrylate (CAS 94108-97-1), Pentaerythritol tetraacrylate (CAS 4986-89-4), ethoxylated pentaerythritol tetraacrylate (CAS 51728-26-8).

Specific examples of pentafunctional acrylates include Dipentaeritritol pentaacrylate (CAS 60506-81-2).

Specific examples of hexafunctional acrylates include Dipentaerythritol hexaacrylate (CAS 29570-58-9).

First luminescent crystals: Suitable first luminescent crystals 11 are of the perovskite structure. Advantageously, the first luminescent crystals are selected from compounds of formula (I):

$$[M^1A^1]_aM^2{}_bX_c \qquad (I),$$

wherein
A' represents one or more organic cations, preferably selected from the group consisting of formamidinium, ammonium, guanidinium, protonated thiourea, imidazolium, pyridinium, pyrrolidinium;

$M^1$ represents one or more alkaline metals, preferably selected from Cs, Rb, K, Na, Li;

$M^2$ represents one or more metals other than $M^1$, preferably selected from the group consisting of Ge, Sn, Pb, Sb, and Bi;

X represents one or more anions selected from the group consisting of halides and pseudohalides and sulfide, preferably: chloride, bromide, iodide, cyanide, thiocyanate, isothiocyanate and sulfide, particularly preferably one or more halides selected from the group consisting of Cl, Br, and I;

a represents 1-4, preferably 1;

b represents 1-2, preferably 2;

c represents 3-9, preferably 3;

wherein either $M^1$ or $A^1$ or $M^1$ and $A^1$ being present. Such compounds of formula (I) are known per se and described in WO2018/028869, the content thereof being included by reference.

In one embodiment, organic cations $A^1$ are present in a compound of formula (I), while metallic cations $M^1$ are not present ($A^1 \neq 0$; $M^1 = 0$; "organic cation perovskites", or simply "organic perovskites"). In one embodiment, organic cations $A^1$ are not present in a compound of formula (I), while metallic cations $M^1$ are present ($A^1 = 0$; $M^1 \neq 0$; "inorganic cation perovskites", or simply "inorganic perovskites"). In one embodiment, organic cations $A^1$ and metallic cations $M^1$ are present ($A^1 \neq 0$; $M^1 \neq 0$, "hybrid cation perovskites", or simply "hybrid perovskites").

The compounds of formula (I) include stoichiometric and non-stoichiometric compounds. Compounds of formula (I) are stoichiometric, in case a, b and c represent a natural number (i.e. positive integers); they are non-stoichiometric, in case a, b and c represent a rational number, excluding natural numbers.

Suitable organic cations $A^1$ may be selected from the group consisting of formamidinium cations (IV-1), ammonium cations (IV-2), guanidinium cations (IV-3), protonated thiourea cations (IV-4), imidazolium cations (IV-5), pyridinium cations (IV-6), pyrrolidinium cations (IV-7),

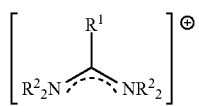
(IV-1)

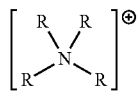
(IV-2)

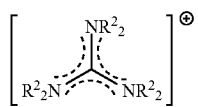
(IV-3)

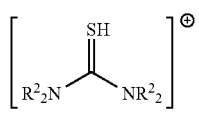
(IV-4)

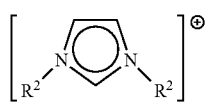
(IV-5)

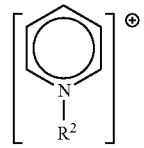
(IV-6)

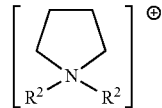
(IV-7)

wherein the substituents R represents, independent from each other, hydrogen, or $C_{1-4}$ alkyl, or phenyl, or benzyl and in case R is connected to carbon it additionally represents independent from each other halide or pseudohalide. For (IV-1), $R^2$ preferably represents hydrogen; and $R^1$ preferably represents methyl or hydrogen or halide or pseudohalide. Preferred cations are selected from the group consisting of the acetamidinium, formamidinium (FA). FA is the preferred cation.

For (IV-2), R preferably represents hydrogen and methyl, ethyl, n-propyl, iso-propyl, n-butyl, iso-butyl, tert-butyl, phenyl, benzyl. Preferred cations are selected from the group consisting of benzylammonium, iso-butylammonium, n-butylammonium, t-butylammonium, diethylammonium, dimethylammonium, ethylammonium, methylammonium (MA), phenethylammonium, iso-propylammonium, n-propylammonium. MA is the preferred cation.

For (IV-3), $R^2$ preferably represents hydrogen, resulting in the parent compound, the guanidinium cation.

For (IV-4), $R^2$ preferably represents hydrogen, resulting in the parent compound, the protonated thiourea cation.

For (IV-5), $R^2$ preferably represents methyl or hydrogen. Imidazolium is the preferred cation.

For (IV-6), $R^2$ preferably represents methyl or hydrogen. Pyridinium is the preferred cation.

For (IV-7), $R^2$ preferably represents methyl or hydrogen. Pyrrolidinium is the preferred cation.

In one embodiment, the invention relates to LCs of formula (I), where $A^1$=FA.

In one embodiment, the invention relates to LCs of formula (I), where $M^1$=Cs.

In one embodiment, the invention relates to LCs of formula (I), where $M^2$=Pb.

In one embodiment, the invention relates to LCs of formula (I), where X is a combination of at least two elements selected from the list of Cl, Br, I. In one embodiment, the invention relates to LCs/QDs of formula (I), where X represents a single element selected from the list of Cl, Br, and I.

In one embodiment, the invention relates to LCs of formula (I), selected from $FA_1Pb_1X_3$, particularly $FAPbBr_3$, $FAPbBr_2I$.

In one further embodiment, the invention relates to LCs of formula (I) further including dopants, i.e. wherein part of $M^1$ is replaced by other alkaline metals, or wherein part of $M^2$ is replaced by other transition metals or rare earth elements, or wherein part of X is replaced by other halogenides, or wherein part of $A^1$ is replaced by other cations as defined herein. Dopants (i.e. replacing ions) are generally present in an amount of less than 1% in respect to the ion they are replacing.

Second luminescent crystals: As outlined above, a further class of LCs, second luminescent crystals 12, may or may not be present. Second luminescent crystals 12, if present, are embedded in the second polymer P2. Such second LCs may be selected from a large variety of known LCs, known to the skilled person. Suitable second LCs (12) may be selected from one or more of core-shell QDs and micron-sized phosphors. Particularly suitable are core-shell QDs such as CdSe or InP-based QDs, most preferably InP-based QDs.

A particularly suitable micron-sized phosphor is selected from KSF ($K_2SiF_6:Mn^{4+}$).

Advantageously, second luminescent crystals 12 are not of the perovskite structure. Accordingly, second luminescent crystals 12 exclude compounds of formula (I) as described herein.

Third Luminescent Crystals: A further class of LCs, third luminescent crystals 13, may or may not be present. Third luminescent crystals 13, if present, are embedded in the first polymer P1. Such third LCs may be selected from a large variety of known LCs, known to the skilled person. third LCs (12) may be selected from one or more of core-shell QDs and micron-sized phosphors and perovskites. Particularly suitable are core-shell QDs such as CdSe or InP-based QDs, most preferably InP-based QDs.

A particularly suitable micron-sized phosphor is selected from KSF ($K_2SiF_6:Mn^{4+}$).

Third luminescent crystals 13 may be of the perovskite structure. Accordingly, third luminescent crystals 13 include compounds of formula (I) as described herein, but being different from first luminescent crystals and thus having a different wavelength of luminescence. This is achieved by selecting a different chemical composition and/or a different size for the third luminescent crystals compared to the first luminescent crystals.

In one embodiment, the luminescent component comprises overall between 2 to 30, preferably 2-5 different luminescent crystals 11 (and 12, 13 if present) leading to a tunable emission spectrum of the luminescent component.

The concentration of luminescent crystals 11 (and 12, 13 if present) may vary over a broad range. In the case of the luminescent component comprising first LCs only but no $2^{nd}$ or $3^{rd}$ LC, not only a single first LC is provided in the luminescent component, but multiple $1^{st}$ LCs in order to enhance its luminosity. In the case of the luminescent component comprising first and second LCs only but no $3^{rd}$ LCs, multiple first LCs and multiple second LCs are provided in the luminescent component in order to enhance its luminosity. In the case of the luminescent component comprising first, second and third LCs, multiple first LCs, multiple second LCs and multiple further LCs of each kind are provided in the luminescent component in order to enhance its luminosity. Preferably, a concentration of the first luminescent crystals with respect to P1 is between 0.01 wt % and 10.0 wt %, preferably between 0.02 wt % and 7.6 wt %, most preferably between 0.05 wt % and 1.0 wt %.

Further materials: The first element may contain further materials. Such further materials include solvents, plasticizers, stabilizing agents (e.g. surfactants, ligands, dispersants), viscosity modifiers, catalysts (e.g. polymerization initiators), non-reacted monomers, antiplasticizers. Such further materials are known to the skilled person. The selection of type and amount thereof being routine work for the skilled person.

In one embodiment, the first element 1 contains an encapsulation comprising of a first polymer P1 and solvent, particularly an apolar solvent with boiling point (bp)>100° C. Preferably the apolar solvent is an aliphatic solvents having 4-24 carbon atoms, preferably 8-22 carbon atoms, most preferably 12-20 carbon atoms. The solvent may be present in an amount of <20 wt %, preferably <10 wt %, most preferably <5 wt %.

In a further embodiment the polymer P1 additionally comprises a plasticizer compound for reducing the Tg. Such plasticizer compounds can be reactive (polymerizable) or non-reactive (not polymerizable). Reactive plasticizers include acrylic esters, such as e.g. lauryl-acrylate, stearyl-acrylate. Non-reactive plasticizers include esters such as e.g. Bis(2-ethylhexyl) phthalate.

In a further embodiment the polymer P1 additionally comprises an anti-plasticizer compound. Antiplasticizers are any small molecule or oligomer additives which, at certain concentrations, increase the Young's modulus while decreasing the glass transition temperature.

In one embodiment, the second element consists of a second polymer P2.

In one alternative embodiment, the second element 2 contains further materials. Such further materials include solvents, stabilizing agents (e.g. surfactants, ligands, dispersants), viscosity modifiers, catalysts (e.g. polymerization initiators), non-reacted monomers, scattering particles. Such further materials are known to the skilled person and also discussed above in the context of the first element 1. The selection of type and amount thereof being routine work for the skilled person.

In one embodiment, the second element 2 contains an encapsulation comprising of a second polymer P2 but no solvent.

In one embodiment, the second element 2 contains a second polymer P2 and scattering particles selected from the group of organic and inorganic scattering particles. Materials for scattering particles comprise silicone (e.g. organopolysiloxanes), titania, zirconia, alumina, silica.

In one embodiment, the first and second polymer compositions comprise in addition to the hardened/cured polymer and the luminescent crystals of the respective type, one or more surfactant selected from the group consisting of non-ionic, anionic, cationic and zwitter-ionic surfactants; preferably selected from the group of zwitter-ionic surfactants.

In view of the intended use, the first and second polymer compositions comprising hardened/cured polymers P1 and P2 preferably are light transmissive, i.e. non-opaque for allowing light emitted by the luminescent crystals, and possible light of a light source used for exciting the luminescent crystals to pass.

Further Elements: The luminescent component may, in addition to first and second element, comprise further elements, such as protecting layers, substrates.

Protecting layers: One option of protecting layers are barrier layers. The luminescent component 4 optionally comprises one or more barrier layers 5. Such barrier layers are located on top of an otherwise exposed surface of the luminescent component. In a preferred embodiment, barrier films may be attached to both sides of the luminescent component in case of a rectangular, sheet-like luminescent component.

Such protecting layers (e.g. barrier films) are known in the field; typically comprising a material/a combination of materials with low water vapour transmission rate (WVTR) and/or low oxygen transmission rate (OTR). By selecting such materials, the degradation of the LCs in the component in response to being exposed to water vapor and/or oxygen is reduced or even avoided. Barrier layers or films preferably have a WVTR<10 (g)/(m^2*day) at a temperature of 40°

C./90% r.h. and atmospheric pressure, more preferably less than 1 (g)/(m^2*day), and most preferably less than 0.1 (g)/(m^2*day).

In one embodiment, the barrier film may be permeable for oxygen. In an alternative embodiment, the barrier film is impermeable for oxygen and has an OTR (oxygen transmission rate)<10 (mL)/(m^2*day) at a temperature of 23° C./90% r.h. and atmospheric pressure, more preferably <1 (mL)/(m^2*day), most preferably <0.1 (mL)/(m^2*day).

In one embodiment, the barrier film is transmissive for light, i.e. transmittance visible light>80%, preferably >85%, most preferably >90%.

Suitable barrier films may be present in the form of a single layer. Such barrier films are known in the field and contain glass, ceramics, metal oxides and polymers. Suitable polymers may be selected from the group consisting of polyvinylidene chlorides (PVdC), cyclic olefin copolymer (COC), ethylene vinyl alcohol (EVOH), high-density polyethylene (HDPE), and polypropylene (PP); suitable inorganic materials may be selected from the group consisting of metal oxides, silica, silicon nitride, alumina. Most preferably, a polymer humidity barrier material contains a material selected from the group of PVdC and COC.

Most preferably a polymer oxygen barrier material contains a material selected from EVOH polymers.

Suitable barrier films may be present in the form of multilayers. Such barrier films are known in the field and generally comprise a substrate, such as PET with a thickness in the range of 10-200 µm, and a thin inorganic layer comprising materials from the group of $SiO_x$ and $AlO_x$ or an organic layer based on liquid crystals which are embedded in a polymer matrix or an organic layer with a polymer having the desired barrier properties. Possible polymers for such organic layers comprise for example PVdC, COC, EVOH.

Substrate: The luminescent component 4 optionally comprises a substrate 3. Such substrates are known in the field and include flat substrates (FIG. 2, FIG. 3A) particularly suited for films and matrices (as outlined below) and structured substrates (FIG. 3B) particularly suited for pixels (as outlined below).

Architecture: The luminescent component may be present in various architectures, including films (c.f. FIG. 2), pixels (c.f. FIG. 3) and matrices (c.f. FIG. 4). To achieve the beneficial effect, particularly stability towards temperature and humidity, the second element at least partially covers and thereby seals said first element. By this measure, a direct contact of the first element to the environment is reduced or even avoided. Depending on the architecture, of the component and device, selected surfaces of the first element are covered by the second element. For example, one surface (e.g. the top surface of a pixel-like structure) is covered. Alternatively, two surfaces (e.g. both sides of a film-like structure) are covered. Accordingly, the expression "at least partially covers" refers to at least 50% and up to 100% of the first element's surface. Advantageously, the second element is in direct contact to the first element to thereby achieve the sealing effect.

In one embodiment, the luminescent component is configured such that the second element covers >50%, preferably >70%, preferably >90%, most preferably >99% of the total surface of the first element (or first elements if more than one element is present). To further illustrate this situation based on FIG. 2A: Given a luminescent component (4) in the form of a film of 10 cm×10 cm comprising a first element (1) as a layer of 100 µm thickness sandwiched between two second elements (2) on its surfaces, such second elements will cover 99.8% of the first element, 0.2% not being covered (the edges).

In one embodiment, the luminescent component may have the shape of a film, i.e. with a length and width exceeding a thickness of the luminescent component, and preferably exceeding the thickness at least ten times. The thickness of this film or layer may vary over a broad range, but typically is 1-500 microns. In one embodiment, the luminescent component as described herein is in the form of a film, said film comprising the following layered structure:

layer of first element-layer of second element (i.e. P1 being covered on one side with P2); or layer of second element-layer of first element-layer of second element (i.e. P1 being covered on both sides with P2); or barrier layer (5)-layer of second element-layer of first element-layer of second element-barrier layer (5) (i.e. P1 being covered on both sides with P2 and additionally protected by a barrier layer on both sides).

barrier layer (5)-layer of first element embedded in second element-barrier layer (5) (i.e. P1 being fully covered with P2 and additionally protected by a barrier layer on both sides).

In one embodiment of the film like component the first element is not covered by the second element at the edges of the film (first element is exposed to air).

Such films are particularly useful as QD backlight films or down conversion films in LCD displays.

In one embodiment the thickness of the second element of a film-like component is >1 µm, preferably >10 µm, preferably >30 µm, preferably >50 µm, most preferably >100 µm.

In one embodiment the second element of a film-like component contains scattering particles between 0.1-30 wt %.

In one embodiment the second polymer (P2) of a film-like component has a "film-related WVTR"<1 g/(m2*day), preferably <0.3 g/(m2*day), most preferably <0.1 g/(m2*day). The "film-related WVTR" is determined/calculated from the WVTR (in (g*mm)/(m2*day)) as described above by dividing it with the film thickness (in mm).

In one embodiment, the luminescent component may have the shape of pixels, particularly, wherein one or more first elements (1) are arranged on a substrate (3) and covered by a layer comprising said second element (2); or a layer comprising said first element (1) is arranged on a substrate (3) and coated by a layer comprising said second element (2).

In one embodiment, the luminescent component may have the form of a matrix, wherein a plurality of first elements (1) are dispersed in a matrix and fully covered by the second element (2). It is preferred, that a mean diameter of the first elements is between 1 µm and 500 µm, preferably between 5 µm and 100 µm. Preferably, the $2^{nd}$ element fully encloses the first element.

Inventive components 4 show good stability. Embodiments of the present components 4 show improved thermal stability at e.g. 90° C./ambient humidity (i.e. <5% r.h.) and improved blue light radiation stability at e.g. 280 mW/cm2 (460 nm wavelength). Embodiments of the present components 4 show improved stability towards humidity at e.g. 60° C./90% r.h. and improved blue light radiation stability at e.g. 280 mW/cm2 (460 nm wavelength)

Embodiments of the present components 4 show a quantum yield>60%, and preferably >80%, most preferably >90%, preferably when excited by blue light. In addition, owed to the material selection, the crystal size, and the strict covering of first LCs, sharp wavelength distributions can be achieved in the emitted light, such that the quality of the resulting emitted light is superior. Preferably, the FWHM (Full Width at Half Maximum) of the solid polymer composition of each of the elements for visible emissions is <50 nm, preferably, <40 nm, and most preferably <30 nm. For example, an FWMH for the emission peak at 525 nm of 23 nm can be observed, at the same time measuring a high luminescence quantum yield of the component of e.g. 86% (see example 4).

Embodiments of the present components 4 comply with RoHS ("Restriction of Hazardous Substances") Directive by the European Union. At the time of filing the present patent application the applicable directive 2011/65/EU generally restricted the use of the following elements: Lead (Pb)<1000 ppm by weight, Mercury (Hg)<1000 ppm, Cadmium (Cd) <100 ppm, Hexavalent chromium (Cr6+)<1000 ppm, Polybrominated biphenyls (PBB)<1000 ppm, Polybrominated diphenyl ether (PBDE)<1000 ppm. On the one hand, this is achieved by selecting Cd-free material, which still provides excellent quantum yield/performance. The limit for Pb according to the RoHS Directive Version 2 (2011/65/EU) is less than 1000 ppm, which is achieved in total for the component as such. Preferably the total Pb concentration for the first and second elements together of the present embodiments is below 1000 ppm, more preferably between 30 ppm and less than 1000 ppm, and most preferably between 100 ppm and 900 ppm. In another preferred embodiment, the total Pb concentration for the first element of the present embodiments is below 1000 ppm, more preferably between 30 ppm and less than 1000 ppm, and most preferably between 100 ppm and 900 ppm. The RoHS compliance may be achieved by selecting an appropriate concentration of the first and possibly second or third luminescent crystals respectively, and preferably by selecting an appropriate concentration of elements in the component. The subject concentration can be measured by MS or XRF measurements.

In summary, the beneficial properties observed—including a concurrent high quantum yield, RoHS compliance, a stable peak position and narrow FWHM in the emitted spectrum, and a high stability towards temperature and humidity and high blue radiation—represent a major achievement of the present invention over the art.

As to further specifying optical properties, it is preferred that the luminescent component has a haze between 10 and 95%, preferably between 80 and 95%. A haze may be introduced by scattering particles with RI>2.0 and size of 100-1000 nm, or by microstructures or microcrystalline polymer structures, or by micron-sized second luminescent crystals, or by the elements itself.

According to a second aspect of the present invention, a light emitting device is provided. The luminescent component preferably is an intermediate good that is assembled together with other components into a light emitting device, such as a display or lighting device. Accordingly, a light emitting device comprises a luminescent component according to any of the preceding embodiments and a light source for emitting blue light. The light source is arranged for exciting the luminescent component. Accordingly, the light source is in optical communication with the luminescent component. Blue light is considered to have a wavelength in a range between 400 and 490 nm. Accordingly, the device is configured to emit light of wavelengths which are defined by the luminescent crystals of the luminescent component.

In embodiments of the invention, the light emitting device described herein is selected from the group consisting of displays, particularly liquid crystal displays, OLED displays, QLED displays (electroluminescent), micro LED displays; and lighting devices, particularly LEDs, OLEDs, QLEDs. Thus, as part of an LCD, OLED, LED or micro LED, the component may contribute to such display (e.g. of a mobile or stationary computing, telecommunication, or television device) or to such lighting device.

In yet another embodiment of this invention the light source is an OLED stack. In this case, the luminescent component is preferably arranged to cover the whole OLED stack or at least parts of it.

According to another aspect of the present invention, luminescent component of any of the preceding embodiments is used for emitting white light in response to the luminescent component being radiated by blue light, in particular as a backlight in a liquid crystal display. For this purpose, a blue light source may be provided in the device for exciting luminescent reactions in the luminescent component. In case the luminescent component comprises first elements emitting green light and second elements emitting red light, together with the blue light emission of the light source, the luminescent component emits white light resulting as a combination of the emission of red and green light in response to an excitation of the luminescent crystals in the first and second element respectively, and from the transmission of the blue light stemming from the light source which blue light is also used to excite the first and the second element. An intensity proportion of the red, green and blue light emitted preferably is in the range of a 1/3 each.

According to a third aspect of the present invention, methods for manufacturing luminescent components and light emitting devices are provided. Such manufacturing follows known methods for preparing films or pixels. Suitable are, for example coating and printing technologies. It is considered advantageous that known manufacturing equipment can be used to prepare the luminescent components and lighting devices of this invention. Broadly speaking, the manufacturing comprises either (i) providing and curing the first element, followed by coating/printing and curing it with the second element or (ii) providing and curing the second element, followed by coating/printing and curing it with the first element.

In one embodiment (Method A), the method for manufacturing a luminescent component 4 comprises the steps of:
  providing a substrate which is optionally coated with one or more layers;
  applying to said substrate a first liquid polymer composition comprising monomers or oligomers of the first polymer P1, first luminescent crystals 11, optionally solvent, optionally further materials, optionally third luminescent crystals 13;
  optionally heating said liquid first polymer composition at elevated temperature to remove volatile solvents.
  curing said first liquid polymer composition to obtain the first element;
  applying to the thus obtained hardened surface of said first element a second liquid polymer composition comprising monomers or oligomers of the second polymer P2, optionally second luminescent crystals 12, optionally solvent, optionally further materials;
  optionally heating said liquid second polymer composition at elevated temperature to remove volatile solvents.

curing said liquid second polymer composition to obtain the second element, which covers and thereby seals said first element;

optionally applying further coating or finishing steps.

According to this embodiment, the first element is manufactured first, followed by the manufacturing of the second element to thereby obtain the luminescent component.

In one embodiment (Method B), the method for manufacturing a luminescent component 4, comprises the steps of:

providing a substrate which is optionally coated with one or more layers;

applying to said substrate a second liquid polymer composition as defined above;

optionally heating said liquid second polymer composition at elevated temperature to remove volatile solvents.

curing said second polymer composition to obtain the second element;

applying to the thus obtained hardened surface of said second element a first liquid polymer composition as defined above;

optionally heating said liquid first polymer composition at elevated temperature to remove volatile solvents.

curing said liquid first polymer composition to obtain the first element, which is covered and thereby sealed by said second element on its lower surface;

applying further coating or finishing steps.

According to this embodiment, the second element is manufactured first, followed by the manufacturing of the first element to thereby obtain the luminescent component.

In one embodiment (Method C), the method for manufacturing a luminescent component 4, comprises the steps of:

providing two substrates each coated with a layer of the second element laminating a layer of first elements with these coated substrates.

According to this embodiment, the first element is sandwiched between two second elements.

In one embodiment (Method D), the method for manufacturing a luminescent component 4, comprises the steps of:

providing a first liquid polymer composition as defined above by one of a) or b):

a) extracting multiple first elements (1) from the first liquid polymer composition by one of spray-drying, or precipitation, or b) hardening the first liquid polymer composition into the first solid polymer composition, and crushing the first solid polymer composition resulting in multiple first elements (1), mixing the thus obtained first elements (1) into a second liquid polymer composition as defined above, and providing a substrate which is optionally coated with one or more layers;

applying to said substrate said second liquid polymer composition containing the first elements (1);

optionally heating said liquid second polymer composition at elevated temperature to remove volatile solvents.

curing said liquid second polymer composition to obtain the second element, which covers and thereby seals said first elements;

optionally applying further coating or finishing steps.

According to this embodiment, components 4 as shown in FIG. 4 are obtainable.

The individual steps, such as applying (e.g. coating, printing), polymerizing (e.g. radiation polymerization, thermal polymerization, catalytic polymerization), finishing (e.g. coating with further layers) are known per se, but not yet applied to the specific starting materials used herein.

The above mentioned first liquid polymer composition (comprising monomers or oligomers of the first polymer P1, first luminescent crystals 11, optionally solvent, optionally further materials, optionally third luminescent crystals 13) may be prepared by combining a pre-concentrate comprising luminescent crystals 11 with a composition comprising monomers or oligomers of the first polymer P1. Such pre-concentrate preferably comprising further materials selected from the class of surfactants, dispersants, ligands. Such pre-concentrate also being subject of the present invention.

DESCRIPTION OF THE DRAWINGS

Embodiments, examples, experiments representing or leading to embodiments, aspects and advantages of the invention will be better understood from the following detailed description thereof. Such description makes reference to the annexed drawings, wherein.

Figure 1:
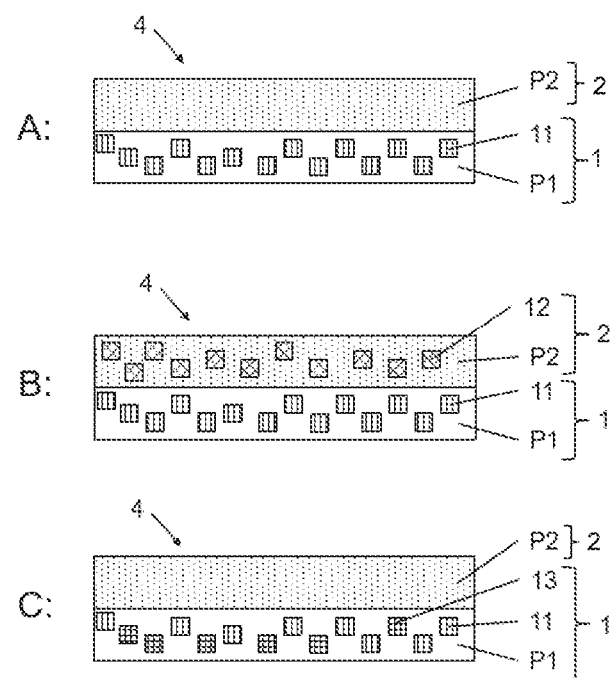
FIG. 1 illustrates a schematic view of a luminescent component (4) according to embodiments of the present invention. A: First luminescent crystals (11) only, B: First (11) and second (12) luminescent crystals, C: First (11) and third (13) luminescent crystals.
Figure 3:
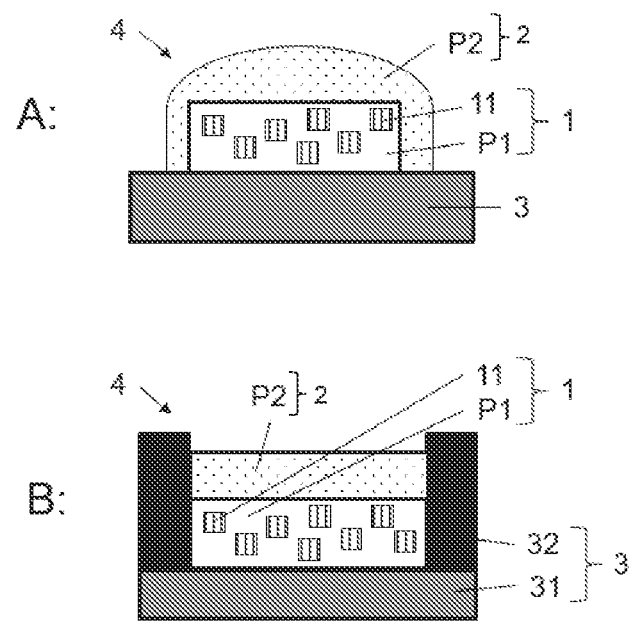
FIG. 3 illustrates a schematic view of a luminescent component in the form of discrete elements according to embodiments of the present invention. A: component with a flat substrate (3), particularly suitable for lighting devices; B: component with a structured substrate (3), particularly suited for pixels.

REFERENCE LIST (P1) First Polymer;
(P2) Second Polymer
(1) First Element;

(2) Second Element
(11) First luminescent crystals
(12) Second luminescent crystals
(13) Third Luminescent crystals
(3), (31), (32) Substrate
(4) Luminescent Component
(5), (51), (52) Protecting layer

EXAMPLES

To further illustrate the invention, the following examples are provided. These examples are provided with no intent to limit the scope of the invention. If not stated otherwise, all of the chemicals were purchased from Aldrich.

Example 1-4: Synthesis of luminescent components according to the invention (fully covered P1 in P2, c.f FIG. 2D. Ex. 1, 2 and 3 for comparison, ex. 4 according to the invention.)

Ink formation: Formamidinium lead tribromide (FAPbBr$_3$) was synthesized by milling PbBr$_2$ and FABr. Namely, 16 mmol PbBr$_2$ (5.87 g, 98% ABCR, Karlsruhe (DE)) and 16 mmol FABr (2.00 g, Greatcell Solar Materials, Queanbeyan, (AU)) were milled with Yttrium stabilized zirconia beads (5 mm diameter) for 6 h to obtain pure cubic FAPbBr$_3$, confirmed by XRD. The orange FAPbBr$_3$ powder was added to Oleylamine (80-90, Acros Organics, Geel (BE)) (weight ratio FAPbBr$_3$:Oleylamine=100:15) and toluene (>99.5%, puriss, Sigma Aldrich). The final concentration of FAPbBr$_3$ was 1 wt %. The mixture was then dispersed by ball milling using yttrium stabilized zirconia beads with a diameter size of 200 μm at ambient conditions (if not otherwise defined, the atmospheric conditions for all experiments are: 35° C., 1 atm, in air) for a period of 1 h yielding an ink with green luminescence.

Film formation: For the first film (P1-glass) 0.1 g of the green ink was mixed with an UV curable monomer/crosslinker mixture (0.7 g FA-513AS, Hitachi Chemical, Japan/ 0.3 g Miramer M240, Miwon, Korea) containing 1 wt % photoinitiator Diphenyl(2,4,6-trimethylbenzoyl) phosphine oxide (TCI Europe, Netherlands) in a speed mixer and the toluene was evaporated by vacuum (<0.01 mbar) at room temperature. The resulting mixture was cured between two glass slides (18×18 mm) with a thickness of approximately 100 μm for 60 s in UV (UVAcube100 equipped with a mercury lamp and quartz filter, Hoenle, Germany). A second film (P2-glass) was prepared as above with 0.1 g green ink and UV curable monomer/crosslinker mixture (0.7 g FA-DCPA, Hitachi Chemical, Japan/0.3 g FA-320M, Hitachi Chemical, Japan) containing 1 wt % photoinitiator Diphenyl (2,4,6-trimethylbenzoyl) phosphine oxide. A third film (P1/ P1-glass) was prepared by preparing a film as described for the first film above but then delaminating this film from the two glass slides. This free-standing film was then coated between two glass slides in the same matrix of (0.7 g FA-513AS, Hitachi Chemical, Japan/0.3 g Miramer M240, Miwon, Korea) containing 1 wt % photoinitiator Diphenyl (2,4,6-trimethylbenzoyl) phosphine oxide and cured as described above. A fourth film (P1/P2-glass) was prepared by preparing a film as described for the first film above but then delaminating this film from the two glass slides. This free-standing film was then coated between two glass slides in a different matrix of (0.7 g FA-DCPA, Hitachi Chemical, Japan/0.3 g FA-320M, Hitachi Chemical, Japan) containing 1 wt % photoinitiator Diphenyl(2,4,6-trimethylbenzoyl) phosphine oxide and cured as described above. The third and fourth film was coated such that the matrix fully covered the free-standing film.

Analysis: Table 1 shows the optical properties of the film as initially obtained and after degradation for 150 hours subjecting the samples to a high temperature test (90° C./dry) (i.e. ambient humidity, approximately 2% relative humidity), a high temperature/high humidity test (60° C./90% rH) and a high flux test (blue LED light, 460 nm blue emission, 280 mW/cm2, 50° C., LEDcube100, Hoenle, Germany). The light intensity was measured with a UV meter equipped with a VIS area sensor (Hoenle, Germany). The resulting optical properties of the film were measured with a spectrofluorimeter equipped with an integrating sphere (Quantaurus Absolute PL quantum yield measuring system C1134711, Hamamatsu).

TABLE 1

| Ex. #: (description) | test condition | PLQY (%) | PP (nm) | FWHM (nm) | rel. ΔPLQY* |
|---|---|---|---|---|---|
| | comparison | | | | |
| 1: P1-glass | initial | 90 | 526 | 23 | N/A** |
| (FA-513AS/Miramer | 150 h (90° C./dry) | 51 | 526 | 22 | −43% |
| M240 + green LCs) | 150 h (60° C./90% rH) | 80 | 526 | 23 | −11% |
| | 150 h high flux | 84 | 524 | 24 | −7% |
| 2: P2-glass | initial | 90 | 525 | 23 | N/A** |
| (FA-DCPA/FA- | 150 h (90° C./dry) | 72 | 525 | 23 | −20% |
| 320M + green LCs) | 150 h (60° C./90% rH) | 87 | 527 | 23 | −3% |
| | 150 h high flux | 22 | 522 | 25 | −76% |
| 3: P1/P1-glass | initial | 87 | 525 | 23 | N/A** |
| (FA-513AS/Miramer | 150 h (90° C./dry) | 48 | 526 | 22 | −45% |
| M240 + green LCs) | 150 h (60° C./90% rH) | 79 | 525 | 22 | −9% |
| encapsulated in (FA-DCPA/FA-320M) | 150 h high flux | 88 | 525 | 24 | +1% |
| | inventive | | | | |
| 4: P1/P2-glass | initial | 86 | 525 | 23 | N/A** |
| (FA-513AS/Miramer | 150 h (90° C./dry) | 75 | 526 | 22 | −13% |
| M240 + green LCs) | 150 h (60° C./90% rH) | 87 | 525 | 23 | +1% |
| encapsulated in (FA-DCPA/FA-320M) | 150 h high flux | 80 | 524 | 24 | −7% |

Figure 5:
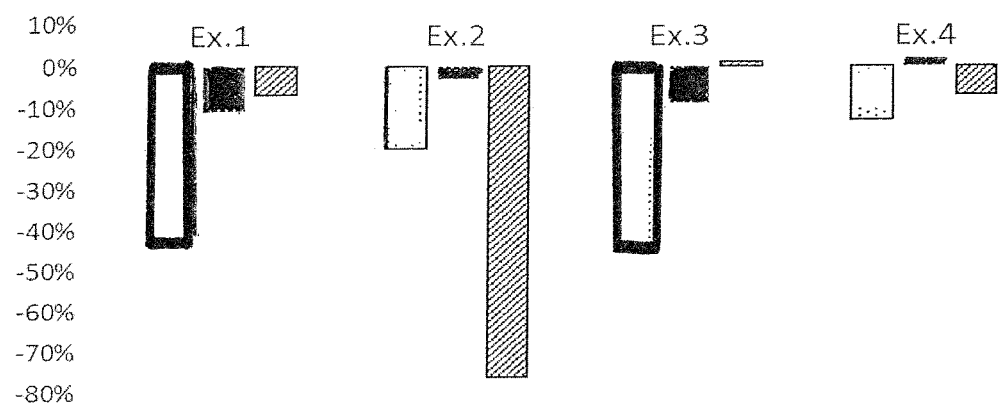
FIG. 5 illustrates the relative photoluminescence quantum yield (PLQY) change after degradation for 150 h of selected luminescent components including a component according to the present invention (example 4).

*rel. ΔPLQY: relative change of PLQY compared to initial value
**N/A: not applicable Conclusion: These results show that a luminescent component as described in this invention (Ex. 4) exhibits excellent initial properties and maintain high optical performance after accelerated degradation in all test conditions (FIG. 5).

Ex. 1 and Ex. 3 show inferior performance after degradation in 90° C./dry and 60° C./90% rH, Ex. 2 inferior performance after degradation in (high flux) rendering these components unsuitable for application in TVs or the like.

Figure 4:
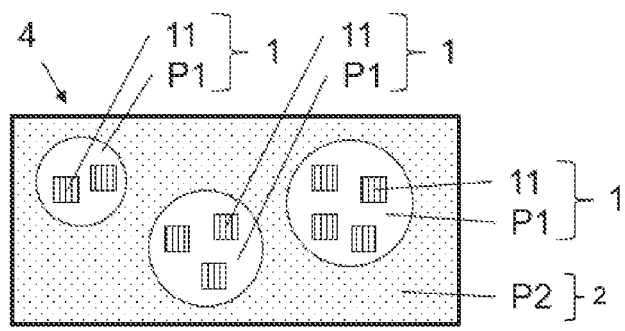
FIG. 4 illustrates a light emitting device of the matrix type according to another embodiment of the present invention.

Examples 5-6: Synthesis of luminescent components according to the invention (fully covered P1 pieces in P2, c.f FIG. 4; Ex. 5 for comparison, ex. 6 inventive)

Ink formation: The ink was prepared as described in examples 1-4.

Film formation: The first film (P1-glass) was prepared like the first film of example 1. A second film (P1/P2-glass) was prepared by preparing a film as described for the first film above. Then this film was delaminated from the two glass slides and cut in small pieces approximately 0.5 mm×0.5 mm×0.1 mm in size. These P1 pieces were then mix into a matrix of (0.7 g FA-DCPA, Hitachi Chemical, Japan/ 0.3 g FA-320M, Hitachi Chemical, Japan) containing 1 wt % photoinitiator Diphenyl(2,4,6-trimethylbenzoyl) phosphine oxide with a weight ratio of 1:3 (P1 pieces/matrix) and subsequently coated and cured as described above. The second film was coated such that the matrix fully covered the P1 pieces.

Analysis: Table 2 shows the optical properties of the film as initially obtained and after degradation for 150 hours subjecting the samples to a high temperature test (90° C./dry) (i.e. ambient humidity, approximately 2% relative humidity), a high temperature/high humidity test (60° C./90% rH) and a high flux test (blue LED light, 460 nm blue emission, 350 mW/cm2, 50° C., LEDcube100, Hoenle, Germany). The light intensity was measured with a UV meter equipped with a VIS area sensor (Hoenle, Germany). The resulting optical properties of the film were measured with a spectrofluorimeter equipped with an integrating sphere (Quantaurus Absolute PL quantum yield measuring system C1134711, Hamamatsu).

Film formation: For the first film (P1-barrier) 0.3 g of the green ink from example 5-6 was mixed with an UV curable monomer/crosslinker mixture (2.1 g FA-513AS, Hitachi Chemical, Japan/0.9 g Miramer M240, Miwon, Korea) containing 1 wt % photoinitiator Diphenyl(2,4,6-trimethylbenzoyl) phosphine oxide (TCI Europe, Netherlands) in a speed mixer and the toluene was subsequently evaporated by vacuum (<0.01 mbar) at room temperature. The resulting mixture was coated with a thickness of 100 μm between two barrier films (TBF1004, i-components, Korea). This barrier film exhibited a WVTR of 0.022 g/(m2*day) (Mocon test) based on the manufacturer's inspection report. Curing was done in a UV belt (BE20/120 W/II, Beltron, Germany) equipped with two mercury lamp and quartz filter. Curing conditions were 31% lamp intensity for both lamps and 4.1 m/min line speed, resulting in a UV energy of about 850 mJ/cm2 measured with a UV integrator type D (Beltron, Germany).

A second film (P2-barrier) was prepared as above with 0.3 g green ink and UV curable monomer/crosslinker mixture (2.1 g FA-DCPA, Hitachi Chemical, Japan/0.9 g FA-320M, Hitachi Chemical, Japan) containing 1 wt % photoinitiator Diphenyl(2,4,6-trimethylbenzoyl)phosphine oxide. Coating thickness was 100 μm and the curing conditions were 75% lamp intensity for both lamps and 5 m/min line speed, resulting in a UV energy of about 1700 mJ/cm2.

A third film (P1/P1-barrier) was prepared by first coating a 30 μm overcoat on two separate barrier films (TBF1004, i-components, Korea) with an UV curable monomer/cross-linker mixture (2.1 g FA-513AS, Hitachi Chemical, Japan/ 0.9 g Miramer M240, Miwon, Korea) containing 1 wt % photoinitiator Diphenyl(2,4,6-trimethylbenzoyl) phosphine oxide (TCI Europe, Netherlands). The overcoat was covered with a cellulose acetate viewfoil and subsequently curing was done with the UV belt at 31% lamp intensity for both

TABLE 2

| Ex. #: (description) | test condition | PLQY (%) | PP (nm) | FWHM (nm) | rel. ΔPLQY* |
|---|---|---|---|---|---|
| | comparison | | | | |
| 5: P1-glass | initial | 95 | 523 | 22 | N/A** |
| (FA-513AS/Miramer | 150 h (90° C./dry) | 74 | 523 | 22 | −22% |
| M240 + green LCs) | 150 h (60° C./90% rH) | 92 | 523 | 22 | −3% |
| | 150 h high flux | 84 | 522 | 24 | −12% |
| | inventive | | | | |
| 6: P1/P2-glass | initial | 88 | 522 | 22 | N/A** |
| (FA-513AS/Miramer | 150 h (90° C./dry) | 89 | 522 | 22 | +1% |
| M240 + green LCs) | 150 h (60° C./90% rH) | 91 | 522 | 22 | +3% |
| encapsulated in (FA-DCPA/FA-320M) | 150 h high flux | 73 | 520 | 24 | −17% |

Figure 6:
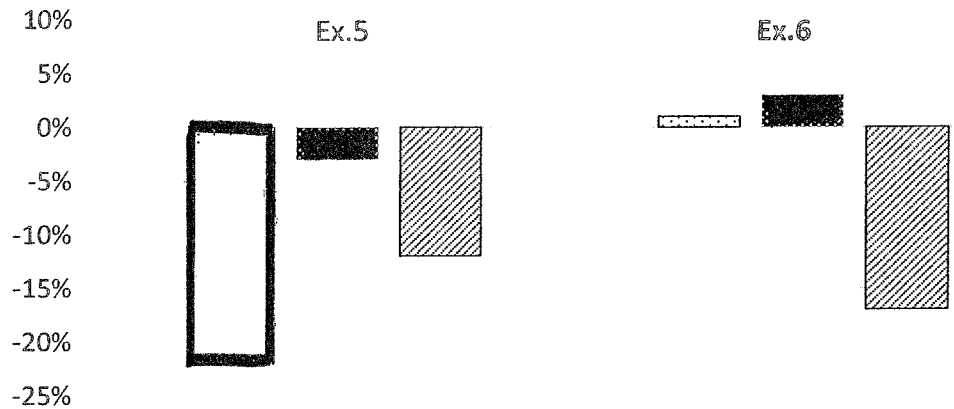
FIG. 6 illustrates the relative photoluminescence quantum yield (PLQY) change after degradation for 150 h of selected luminescent components including a component according to the present invention (example 6).

*rel. ΔPLQY: relative change of PLQY compared to initial value
**N/A: not applicable Conclusion: These results show that a luminescent component as described in this invention (Ex. 6) exhibits excellent initial properties and maintain high optical performance after accelerated degradation in all test conditions (FIG. 6). Ex. 5 shows significantly inferior performance after degradation in 90° C./dry rendering this component unsuitable for application in TVs or the like.

Figure 2:
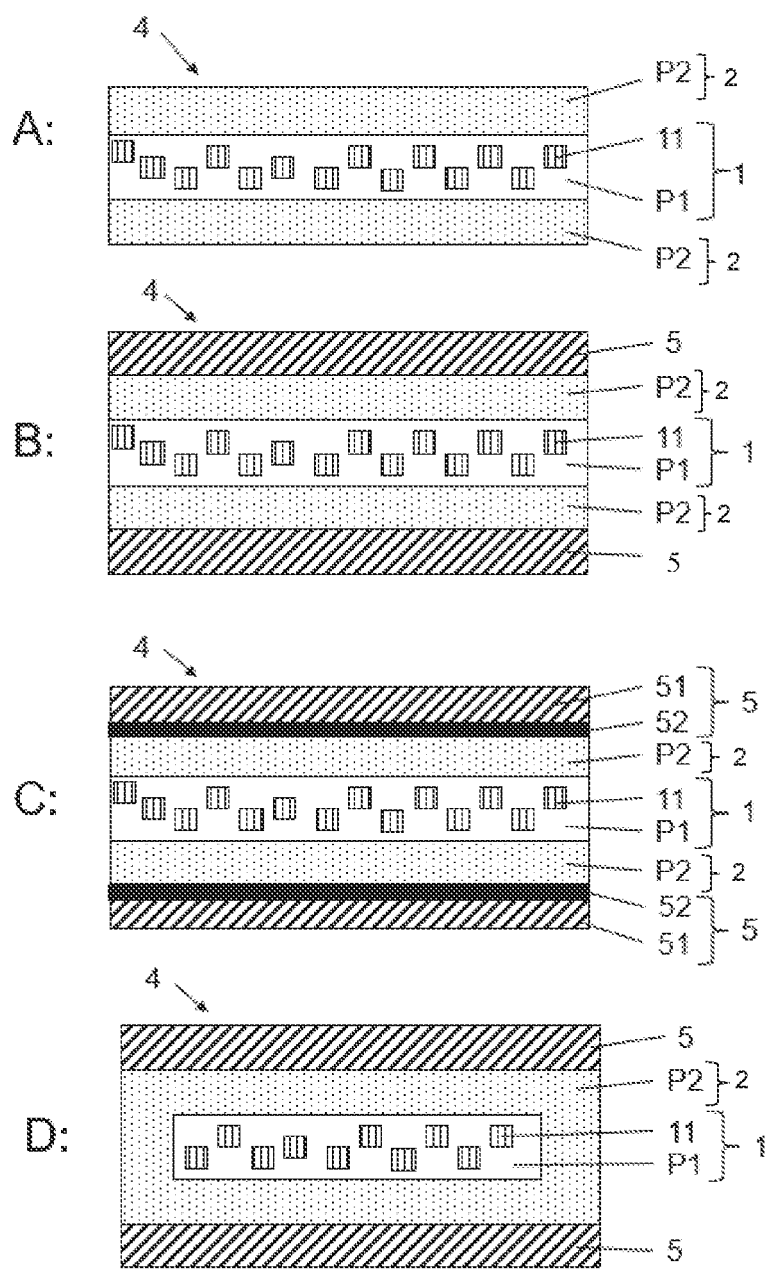
FIG. 2 illustrates a schematic view of a luminescent component (4) in the form of a film according to embodiments of the present invention, such components are particularly suitable for display devices. A: no additional barrier; B: transparent single layer barrier (with no substructure); C: transparent multi-layer barrier (with substructure), D: sheet-like component wherein the first element is fully covered with second element with an additional barrier on both sides.

Examples 7-10: Synthesis of luminescent components according to the invention (partially covered P1 in P2, c.f. FIG. 2A, 2B, 2C). Ex. 7, 8 and 9 for comparison, ex. 10 according to the invention.

Ink formation: The ink was prepared as described in examples 1-4.

lamps and 8.2 m/min line speed, resulting in a UV energy of about 425 mJ/cm2. Then 0.3 g green ink and UV curable monomer/crosslinker mixture (2.1 g FA-513AS, Hitachi Chemical, Japan/0.9 g Miramer M240, Miwon, Korea) containing 1 wt % photoinitiator Diphenyl(2,4,6-trimethyl-benzoyl) phosphine oxide were mixed and toluene evaporated as described above. This mixture was coated (100 μm thickness) between the two overcoated barrier films and cured with 31% lamp intensity for both lamps and 1.0 m/min line speed, resulting in a UV energy of about 3400 mJ/cm2.

A fourth film (P2/P1-barrier) was prepared by first coating a 30 μm overcoat on two barrier films (TBF1004, i-components, Korea) with an UV curable monomer/crosslinker mixture (2.1 g FA-DCPA, Hitachi Chemical, Japan/0.9 g FA320M, Hitachi Chemical, Japan) containing 1 wt % photoinitiator Diphenyl(2,4,6-trimethylbenzoyl) phosphine oxide (TCI Europe, Netherlands). The overcoat was covered with a cellulose acetate viewfoil and subsequently curing was done with the UV belt at 31% lamp intensity for both lamps and 8.2 m/min line speed, resulting in a UV energy of about 425 mJ/cm2. Then 0.3 g green ink and UV curable monomer/crosslinker mixture (2.1 g FA-513AS, Hitachi Chemical, Japan/0.9 g Miramer M240, Miwon, Korea) containing 1 wt % photoinitiator Diphenyl(2,4,6-trimethylbenzoyl) phosphine oxide were mixed and toluene evaporated as described above. This mixture as coated (100 μm thickness) between the two overcoated barrier films and cured with 31% lamp intensity for both lamps and 1.0 m/min line speed, resulting in a UV energy of about 3400 mJ/cm2. Samples of size 3 cm×3 cm were cut from all four films and tested for degradation. By cutting sample from the third (P1/P1-barrier) and fourth film (P2/P1-barrier) the P1 layer containing LCs is subjected to the environment at the cutting surface.

Analysis: Table 3 shows the optical properties of the film as initially obtained and after degradation for 500 hours subjecting the samples to a high temperature test (90° C./dry) (i.e. ambient humidity, approximately 2% relative humidity), a high temperature/high humidity test (60° C./95% rH) and a high flux test (blue LED light, 460 nm blue emission, 280 mW/cm2, 50° C., LEDcube100, Hoenle, Germany). The light intensity was measured with a UV meter equipped with a VIS area sensor (Hoenle, Germany). The performance of the films was obtained by placing the samples on a magenta backlight unit and measuring the optical properties with a spectroradiometer (CS-2000, Konica Minolta).

F1 Phoenix (Netzsch) was used. The $T_g$ was determined on the second heating cycle (the first heating from −90° C. to 250° C. showed overlaying effects besides the glass transition). A first sample (P1+LCs) was prepared similar to the above films from example 7 by mixing 0.3 g of the green ink from example 1-4 with an UV curable monomer/crosslinker mixture (2.1 g FA-513AS, Hitachi Chemical, Japan/0.9 g Miramer M240, Miwon, Korea) containing 1 wt % photoinitiator Diphenyl(2,4,6-trimethylbenzoyl)phosphine oxide (TCI Europe, Netherlands) in a speed mixer and the toluene was subsequently evaporated by vacuum (<0.01 mbar) at room temperature. The resulting mixture was coated with a thickness of 30-40 μm between two 100 μm cellulose acetate viewfoils. Curing was done in a UV belt (BE20/120 W/II, Beltron, Germany) equipped with two mercury lamp and quartz filter. Curing conditions were 31% lamp intensity for both lamps and 1.0 m/min line speed, resulting in a UV energy of about 3400 mJ/cm2 measured with a UV integrator type D (Beltron, Germany). A second sample (P2) was prepared similar to the above films from example 10 by mixing an UV curable monomer/crosslinker mixture (2.1 g FA-DCPA, Hitachi Chemical, Japan/0.9 g FA-320M, Hitachi Chemical, Japan) containing 1 wt % photoinitiator Diphenyl(2,4,6-trimethylbenzoyl) phosphine oxide (TCI Europe, Netherlands) in a speed mixer. The resulting mixture was coated with a thickness of 30-40 μm between two 100 μm cellulose acetate viewfoils. Curing was done in a UV belt (BE20/120 W/II, Beltron, Germany) equipped with two mercury lamp and quartz filter. First curing conditions were 31% lamp intensity for both lamps and 1.0 m/min line speed (UV energy about 3400 mJ/cm2). For both samples (P1+LCs) and (P2) the viewfoils were removed and the remaining films subjected to $T_g$ analysis in

TABLE 3

| Ex. #:<br>(composition) | test<br>condition | x-value*<br>(−) | y-value*<br>(−) | PP<br>(nm) | FWHM<br>(nm) | Δy** |
|---|---|---|---|---|---|---|
| | comparison | | | | | |
| 7: P1-barrier | initial | 0.248 | 0.190 | 526 | 22 | N/A*** |
| (FA-513AS/Miramer | 500 h (90° C./dry) | 0.249 | 0.122 | 541 | 33 | −0.068 |
| M240 + green LCs) | 500 h (60° C./90% rH) | 0.240 | 0.125 | 524 | 22 | −0.065 |
| | 500 h high flux | 0.245 | 0.160 | 524 | 23 | −0.030 |
| 8: P2-barrier | initial | 0.253 | 0.216 | 526 | 23 | N/A** |
| (FA-DCPA/FA- | 500 h (90° C./dry) | 0.253 | 0.209 | 526 | 22 | −0.007 |
| 320M + green LCs) | 500 h (60° C./90% rH) | 0.255 | 0.214 | 527 | 22 | −0.002 |
| | 500 h high flux | 0.261 | 0.096 | 523 | 44 | −0.120 |
| 9: P1/P1-barrier | initial | 0.251 | 0.200 | 525 | 23 | N/A** |
| (FA-513AS/Miramer | 500 h (90° C./dry) | 0.256 | 0.132 | 526 | 27 | −0.068 |
| M240 + green LCs) | 500 h (60° C./90% rH) | 0.250 | 0.183 | 525 | 22 | −0.017 |
| covered by (FA-<br>513AS/Miramer M240) | 500 h high flux | 0.247 | 0.183 | 524 | 24 | −0.017 |
| | inventive | | | | | |
| 10: P2/P1-barrier | initial | 0.252 | 0.208 | 526 | 23 | N/A** |
| (FA-513AS/Miramer | 500 h (90° C./dry) | 0.252 | 0.197 | 526 | 22 | −0.011 |
| M240 + green LCs) | 500 h (60° C./90% rH) | 0.252 | 0.198 | 526 | 23 | −0.010 |
| covered by (FA-<br>DCPA/FA-320M) | 500 h high flux | 0.249 | 0.179 | 523 | 24 | −0.028 |

*x-value, y-value: colour values of the CIE 1931 colour space chromaticity diagram.;
**Δy: absolute change of initial y-value to y-value after 500 h degradation;
***N/A: not applicable Analysis of $T_g$: The glass transition temperature of the elements of the luminescent component as described in this invention was determined by DSC according to DIN EN ISO 11357-2:2014-07 with a starting temperature of −90° C. and an end temperature of 250° C. and a heating rate of 20 K/min in nitrogen atmosphere (20 ml/min). The purging gas was nitrogen (5.0) at 20 ml/min. The DSC system DSC 204 duplicate. The $T_g$ for (P1+LCs) was 77° C. and 74° C. whereas for (P2) $T_g$ was 143° C. and 142° C.

Figure 7:
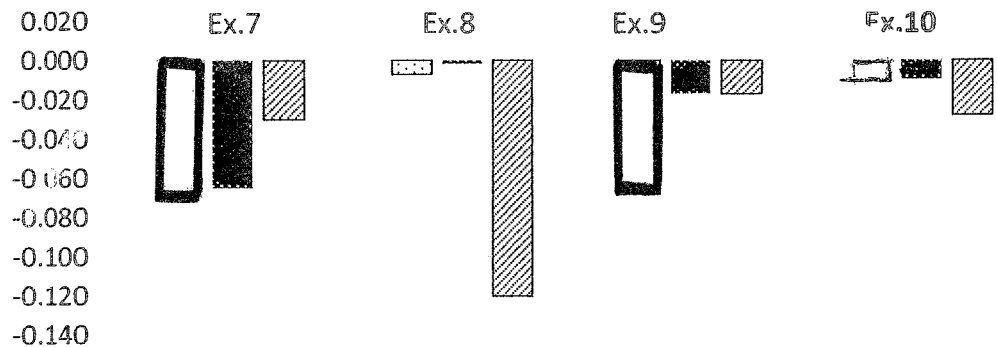
FIG. 7 illustrates the Δy (change of colour coordinate y of the CIE 1931 colour space chromaticity diagram) after degradation for 500 h of selected luminescent components including a component according to the present invention (example 10).

Conclusion: These results show that a luminescent component as described in this invention (Ex. 10) exhibit excellent initial properties and maintain high optical performance after accelerated degradation in all test conditions (FIG. 7). Example 7 shows inferior performance after degradation in (90/dry) and (60° C./90% rH) and example 8 performs significantly worse after degradation in (high flux), while example 9 shows a pronounced degradation in (90° C./dry) rendering these film systems unsuitable for application in TVs or the like.

The invention claimed is:

1. A luminescent component in the form of a film, comprising a first element and a second element, wherein:
said first element comprises a first solid polymer composition, said first polymer composition comprising first luminescent crystals embedded in a first polymer (P1), wherein
said first luminescent crystals are of the perovskite crystal structure and emit light of a first wavelength in response to excitation by light with a wavelength shorter than the first wavelength,
said first polymer (P1) is selected from the group of polymers with Tg<95° C.;
said second element comprises a second solid polymer composition, said second polymer composition optionally comprising second luminescent crystals embedded in a second polymer (P2), wherein
said optional second luminescent crystals are different from said first luminescent crystals and emit light of a second wavelength in response to excitation by light with a wavelength shorter than the second wavelength,
said second polymer (P2) is selected from the group of polymers with WVTR<1 (g*mm)/(m2*day);
said second element at least partially covers and thereby seals said first element; and
said Tg is determined according to DIN EN ISO 11357-2:2014-07, with the exception that measurement is made in a nitrogen atmosphere, during the second heating cycle and applying a heating rate of 20K/min, starting at −90° C. up to 250° C.; and
said WVTR is determined by ISO 15106-3:2003 at a temperature/relative humidity of 40° C./90% r.h.;
wherein the film comprises the following layered structure:
layer of second element-layer of first element-layer of second element.

2. The luminescent component according to claim 1, wherein P1 and/or P2 complies with one or more of the following parameters:
P2 has a $T_g$>115° C.;
P1 has a molar ratio of the sum of (oxygen+nitrogen+sulphur+phosphorous+fluorine+chlorine+bromine+iodine) to carbon<0.9;
P2 has a molar ratio of the sum of (oxygen+nitrogen+sulphur+phosphorous+fluorine+chlorine+bromine+iodine) to carbon<0.9;
WVTR of P1<1 (g*mm)/(m2*day);
Oxygen Transmission Rate (OTR) of P1>1 (cm3*mm)/(m2*day*atm);
light transmittance of P1 and P2>70%, at a thickness of 100 μm;
wherein the first polymer (P1) is not dissolvable in the second polymer (P2), and vice versa.

3. The luminescent component according to claim 1, wherein OTR of P2>1 (cm3*mm)/(m2*day*atm).

4. The luminescent component according to claim 1, wherein the first polymer (P1) is selected from the group of acrylate polymers and wherein the second polymer (P2) is selected from the group of acrylate polymers.

5. The luminescent component according to claim 1, wherein the first polymer (P1) comprises repeating units of formulae (III) and (V) and/or the second polymer (P2) comprises repeating units of formula (VI) and optionally of formula (III):

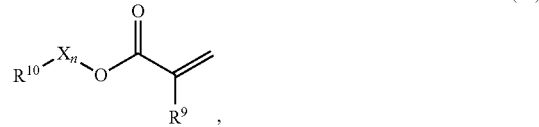

wherein:
$R^9$ represents H or $CH_3$,
$R^{10}$ represents a cyclic, linear or branched $C_{1-25}$ alkyl, or a $C_{6-26}$ aryl group, each optionally substituted with one or more cyclic, linear or branched $C_{1-20}$ alkyl, phenyl or phenoxy,
n represents 0 or 1, and
X represents a spacer from the group of alkoxylates comprising 1-8 carbon atoms and 1-4 oxygen atoms;

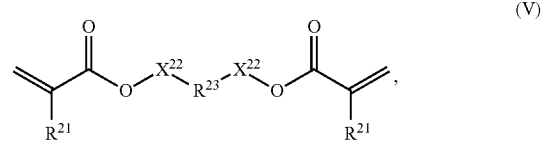

wherein:
$R^{21}$ independently from each other represent H or $CH_3$;
$R^{23}$ represents a cyclic, linear or branched $C_{1-25}$ alkyl, or a $C_{6-26}$ aryl group, each optionally substituted with one or more cyclic, linear or branched $C_{1-20}$ alkyl, phenyl or phenoxy;
$X^{22}$ independently from each other represent a spacer selected from the group of alkoxylates, whereby both substituents $X^{22}$ together comprise 8-40 carbon atoms and 2-20 oxygen atoms;

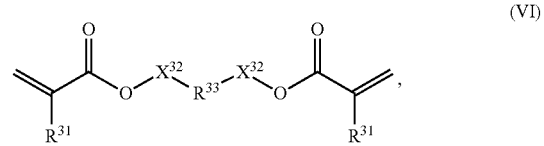

wherein:
$R^{31}$ independently from each other represent H or $CH_3$;
$R^{33}$ represents a cyclic $C_{5-25}$ alkyl, or a $C_{6-26}$ aryl group, each optionally substituted with one or more cyclic, linear or branched $C_{1-20}$ alkyl, phenyl or phenoxy;
$X^{32}$ are independent from each other and are either not present or represent a spacer from the group of alkoxylates, whereby both substituents $X^{32}$ together comprise 1-8 carbon atoms and 1-8 oxygen atoms.

6. The luminescent component according to claim 1, wherein
the first luminescent crystals are selected from compounds of formula (I):

$[M^1A^1]_aM^2{}_bX_c$ 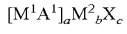 (I), wherein:

$A^1$ represents one or more organic cations,
$M^1$ represents one or more alkaline metals,
$M^2$ represents one or more metals other than $M^1$, X represents one or more anions selected from the group consisting of halides, pseudohalides and sulfide, a represents 1-4, b represents 1-2, c represents 3-9, and wherein either $M^1$, or $A^1$, or $M^1$ and $A^1$ being present;

and/or wherein said first luminescent crystals are perovskite crystals of size between 3-100 nm.

7. The luminescent component according to claim 1, wherein the second luminescent crystals are selected from one or more of core-shell QDs and micron-sized phosphors.

8. The luminescent component according to claim 1, further comprising third luminescent crystals embedded in the first polymer, said third luminescent crystals selected from one or more of perovskite crystals, core-shell QDs and micron-sized phosphors.

9. The luminescent component according to claim 1 wherein the film further comprises a protecting layer on each layer of second element, the film having the following layered structure:

protecting layer-layer of second element-layer of first element-layer of second element, wherein said protecting layer is selected from glass, ceramic, inorganic materials selected from metal oxides, silica, silicon nitride and alumina, and polymer selected from the group consisting of polyvinylidene chlorides (PVdC), cyclic olefin copolymer (COC), ethylene vinyl alcohol (EVOH), high-density polyethylene (HDPE), and polypropylene (PP).

10. A light emitting device, comprising a luminescent component according to claim 1, a light source for emitting blue light, wherein the light source is arranged for exciting the luminescent component.

11. The light emitting device according to claim 10 selected from the group consisting of liquid crystal displays, OLED displays, QLED displays, and micro LED displays; and lighting devices selected from LEDs, OLEDs, and QLEDs.

12. A backlight in a liquid crystal display comprising a luminescent component of claim 1, for emitting white light in response to the luminescent component being radiated by blue light.

13. Method for manufacturing a luminescent component according to claim 1, comprising the steps of:

providing two substrates each coated with a layer of the second element laminating a layer of first elements with these coated substrates.

* * * * *